(12) United States Patent
Mader et al.

(10) Patent No.: US 6,477,358 B1
(45) Date of Patent: Nov. 5, 2002

(54) METHOD FOR CONTROLLING POWER GAIN

(75) Inventors: Thomas Mader, Rheurdt; Gerhard Kottschlag; Gerhard Pitz, both of Hildesheim, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/355,136

(22) PCT Filed: Nov. 6, 1997

(86) PCT No.: PCT/DE97/02565

§ 371 (c)(1),
(2), (4) Date: Nov. 4, 1999

(87) PCT Pub. No.: WO98/33273

PCT Pub. Date: Jul. 30, 1998

(30) Foreign Application Priority Data

Jan. 23, 1997 (DE) .......................................... 197 02 280

(51) Int. Cl.⁷ ............................................... H03G 3/20
(52) U.S. Cl. ..................... 455/91; 455/127; 455/126; 330/129; 330/135
(58) Field of Search ................................ 330/129, 138, 330/279, 130; 455/126, 127, 116, 430, 91; 379/430

(56) References Cited

U.S. PATENT DOCUMENTS

| 5,159,283 | A | * | 10/1992 | Jensen ......................... 330/129 |
| 5,302,913 | A | * | 4/1994 | Hori ............................ 330/129 |
| 5,334,979 | A | * | 8/1994 | Hatakeyama ............... 341/138 |
| 5,363,057 | A | * | 11/1994 | Furuno ........................ 330/129 |
| 5,410,272 | A | * | 4/1995 | Haberland et al. .......... 330/129 |
| 5,697,073 | A | * | 12/1997 | Daniel et al. ............... 455/126 |

* cited by examiner

Primary Examiner—Thanh Cong Le
Assistant Examiner—A. Harry
(74) Attorney, Agent, or Firm—Kenyon & Kenyon

(57) ABSTRACT

Method for controlling the power gain for outputting a transmitted signal from a radio device. At the beginning of the transmitted signal, the output power is increased to a preset power level along a preset characteristic curve. At the end of the transmitted signal, the preset power is decreased along the preset characteristic curve. The power gain is controlled accordingly by a control signal (8, 9). A reference control signal (5) is used for the rising and falling edges of the control signal (8, 9). The control signal (8, 9) is limited to a preset maximum control signal value (6, 7).

9 Claims, 17 Drawing Sheets

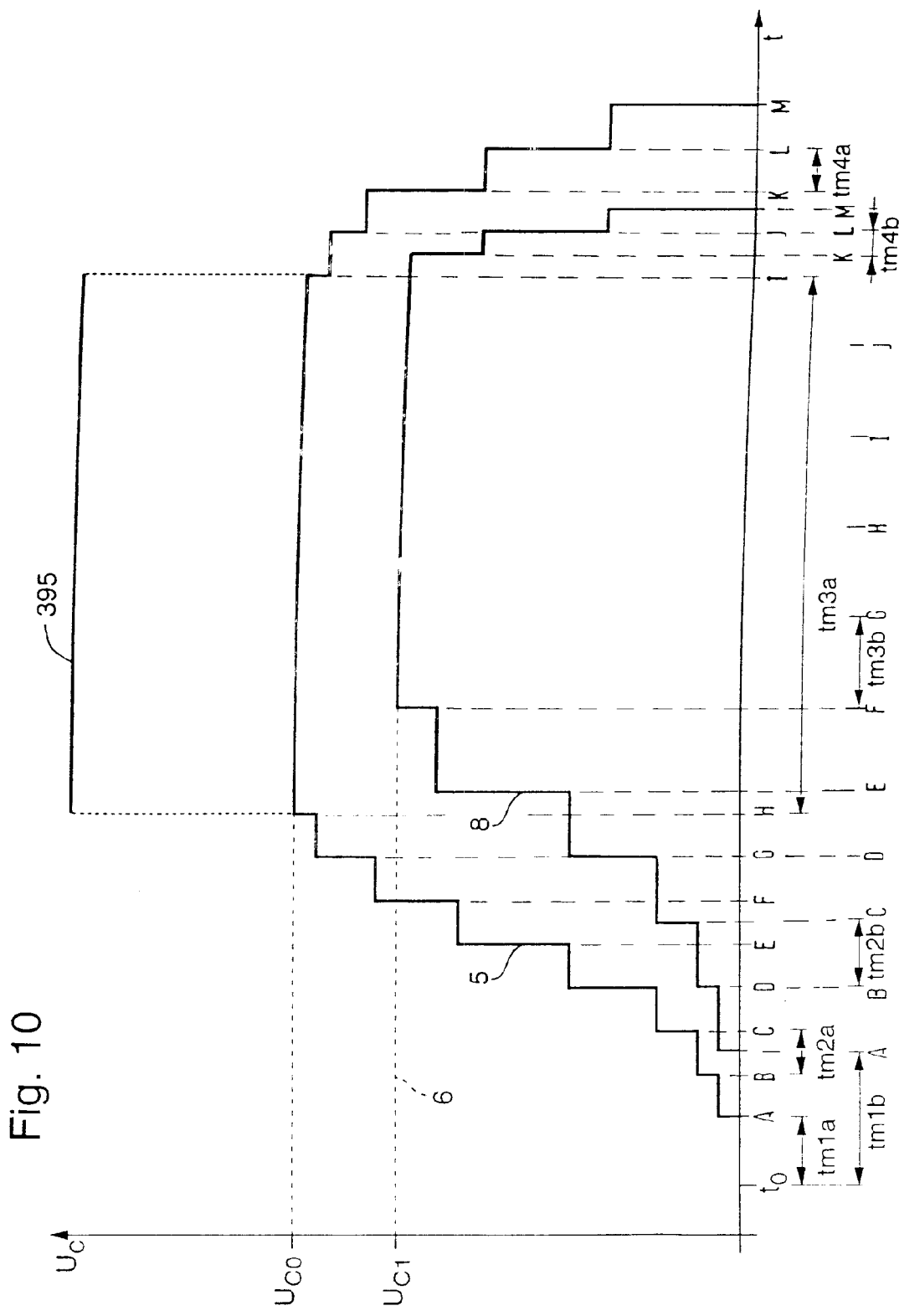

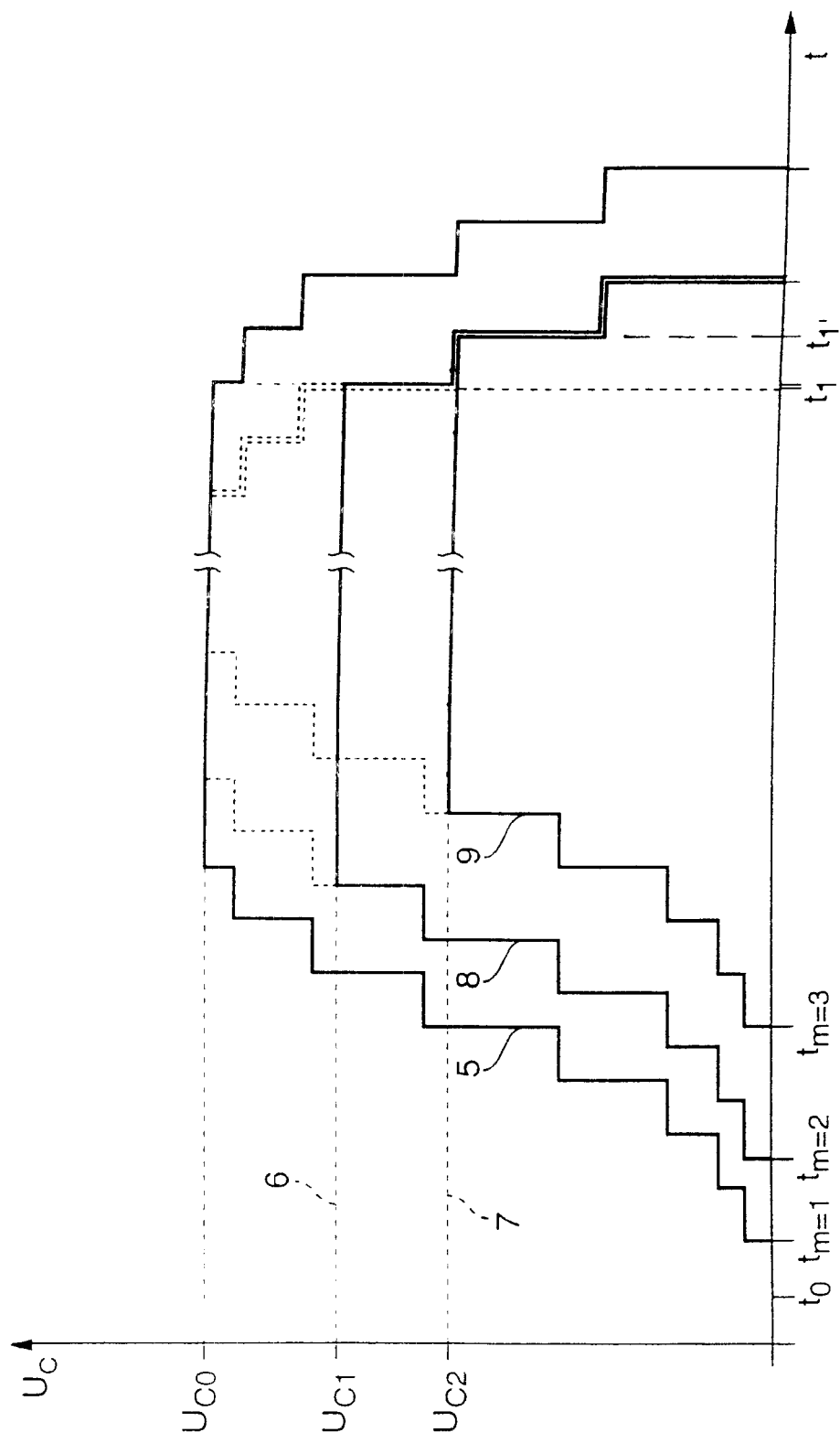

METHOD FOR CONTROLLING POWER GAIN

FIELD OF THE INVENTION

The present invention relates to a method for controlling a power gain.

BACKGROUND INFORMATION

When outputting a transmitted signal from a mobile radio device, the output power is increased continuously to a preset power level at the beginning of the transmitted signal, and the preset power is continuously decreased at the end of the transmitted signal, as is described in "European Digital Cellular Telecommunications System (Phase 2), Radio Transmission and Reception (GSM 05.05), European Telecommunication Standard, May 1994".

SUMMARY OF THE INVENTION

The method according to the present invention having the features of the main claim has an advantage over the related art in that only a single reference control signal is needed for outputting the transmitted signal, even at different presettable power levels. This means that only a small number of memory locations is needed for storing discrete control signal amplitude values.

The features listed in the subclaims provide advantageous embodiments and refinements of the method described in the main claim.

It is advantageous to limit the control signal to a preset maximum value in order to set the preset power for outputting the transmitted signal, for which purpose the reference control signal is compared to the preset maximum control signal value at specific times or continuously, and/or the control signal is limited to the preset maximum control signal value after a preset signal rise time. By doing this, the control signal for setting the target output power of the transmitted signal can be very easily determined, because no complicated arithmetic operations, such as multiplication, are needed, but rather only comparison operations.

It is especially advantageous to switch from the reference control signal to the preset maximum control signal value to limit the control signal. This provides an especially simple means for limiting the control signal to the preset maximum control signal value.

It is also advantageous to output the transmitted signals with preset time offsets as a function of the preset power. This makes it possible to maintain a preset time template for outputting the transmitted signal at different preset power levels.

A further advantage is the ability to easily provide time offsets of this type by delaying the beginning of the transmitted signal.

It is also advantageous to define the intervals between the times at which the reference control signal is compared to the preset maximum control signal value. By defining the intervals in this manner throughout the entire period of transmitted signal output or only during output segments, the time at which the signal starts to fall as well as the rate of rise of the necessary control signal can be easily and flexibly adjusted to the requirements.

It is also advantageous to select the number of reference control signal values assumed by the control signal as a function of the preset power. This makes it possible to skip reference control signal values which exceed the preset maximum control signal value in an easy and uncomplicated manner.

It is further advantageous to determine the actual output power achieved at the output of the power amplification circuit with the aid of a detector and return it to a control loop of the power amplification circuit in the form of a controlled variable. This procedure is an easy way to control the output power.

BRIEF DESCRIPTION OF THE DRAWINGS

Embodiments of the present invention are illustrated in the drawing and explained in greater detail in the description below.

FIG. 10 shows a variation over time of two control signals according to the fourth embodiment;

FIG. 12 shows a variation over time of three control signals according to the fifth embodiment;

DETAILED DESCRIPTION

Figure 1:
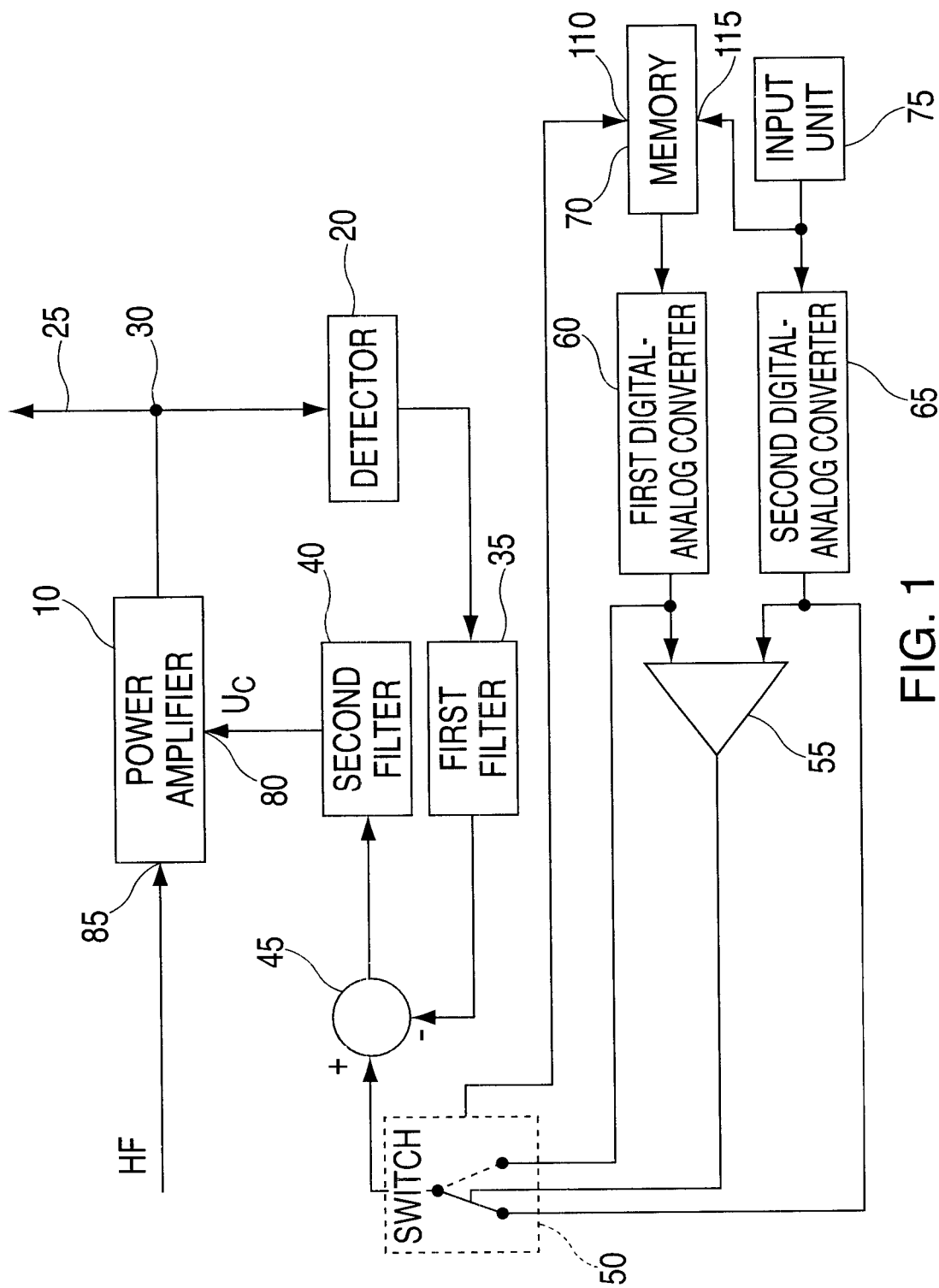
FIG. 1 shows a block diagram of a power amplification control circuit according to a first embodiment.

In FIG. 1, reference number 10 identifies a power amplifier to which a high-frequency transmitted signal is supplied at a first input 85. On the output side, power amplifier 10 is connected to a transmitting antenna 25 via an antenna feed-in point 30 and to the input of a detector 20. The output signal of detector 20 is supplied to the negated (−) input of a summation point 45 via a first filter 35. The output signal of summation point 45 is supplied to a control input 80 of power amplifier 10 via a second filter 40. A non-negated input (+) of summation point 45 is connected to a switch 50. The non-negated input (+) of summation point 45 can be connected to either the output of a first digital-analog converter 60 or the output of a second digital-analog converter 65. The position of switch 50 is controlled by the output of a comparator 55, with comparator 55 having two inputs which are also connected to the output of first digital-analog converter 30 or second digital-analog converter 65. First digital-analog converter 60 is connected on the input side to a memory 70, while second digital-analog converter 65 is connected on the input side to the output of an input unit 75. In FIG. 1, the control signal supplied to control input 80 of power amplifier 10 is represented as control voltage $U_c$.

To detect its switch position, switch 50 is connected to a first input 110 of memory 70. Because the switch position depends on the comparison result, this detection can also take place directly at the output of comparator 55. The output of input unit 75 is also connected to a second input 115 of memory 70.

Figure 3:
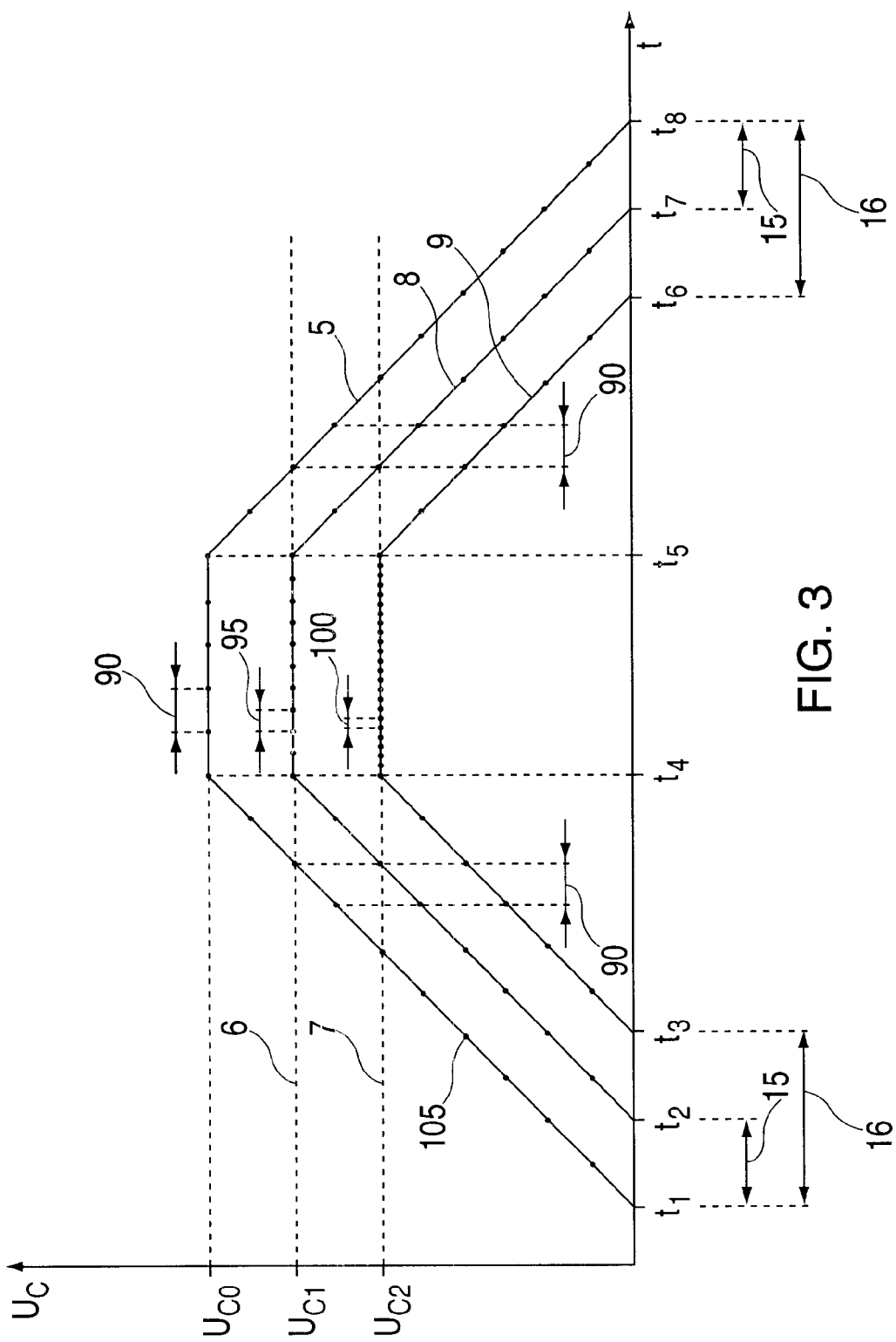
FIG. 3 shows the variation over time of three control signals according to the first embodiment.

The arrangement described in FIG. 1 can be, for example, part of a mobile radio transmitter based on the GSM standard. As stipulated by the GSM mobile radio specifications, the transmitter output stages cannot be turned on and off abruptly at the beginning and end of a transmitted signal, but rather gradually along a suitable characteristic curve using an analog control signal $U_c$ so that as few subsidiary waves as possible are produced. Only one characteristic curve, which is expressed as reference control signal 5 in FIG. 3, is defined. FIG. 3 illustrates a diagram for control signals $U_c$ over time t. Reference control signal 5 increases to its maximum value $U_{c0}$ between a time $t_1$ and a time $t_4$ and drops back to 0 at the same absolute rate between a time $t_5$ and a time $t_8$. Different rates of rise can also be selected. The curve of reference control signal 5 shown in FIG. 3 is a simplified representation of an interpolation of equidistant interpolation points 105, which are separated from one another by a first interval 90. The interpolation points are stored digitally in memory 70. They are converted to analog signal values by first digital-analog converter 60 at the preset times. When maximum value $U_{c0}$ is supplied to control input 80 of power amplifier 10, the maximum output power for the high-frequency transmitted signals is set at power amplifier 10.

The variation of reference control signal 5 shown in FIG. 3 serves to illustrate the method according to the present invention and must be adapted to the defined specifications, for example, the mobile radio specifications based on the GSM standard, especially with regard to its rising and falling edges. The power for outputting the high-frequency transmitted signal via transmitting antenna 25 can be defined at input unit 75. To do this, a maximum control signal value 6, 7 needed to achieve the preset output power is measured in digitized form in input unit 75. Second digital-analog converter 65 supplies preset maximum control signal value 6, 7 to the corresponding input of comparator 55 in analog form.

The output power levels that can be defined at input unit 75 are less than or equal to the maximum possible output power at the output of power amplifier 10. This means that preset maximum control signal values 6, 7 are also less than or equal to maximum value $U_{c0}$ according to FIG. 3. In FIG. 3, a first maximum control signal 6, which has a value $U_{c1}$, is less than maximum value $U_{c0}$, and a second maximum control signal 7, which has a value $U_{c2}$, is less than value $U_{c1}$ of first maximum control signal 6.

Figure 2:
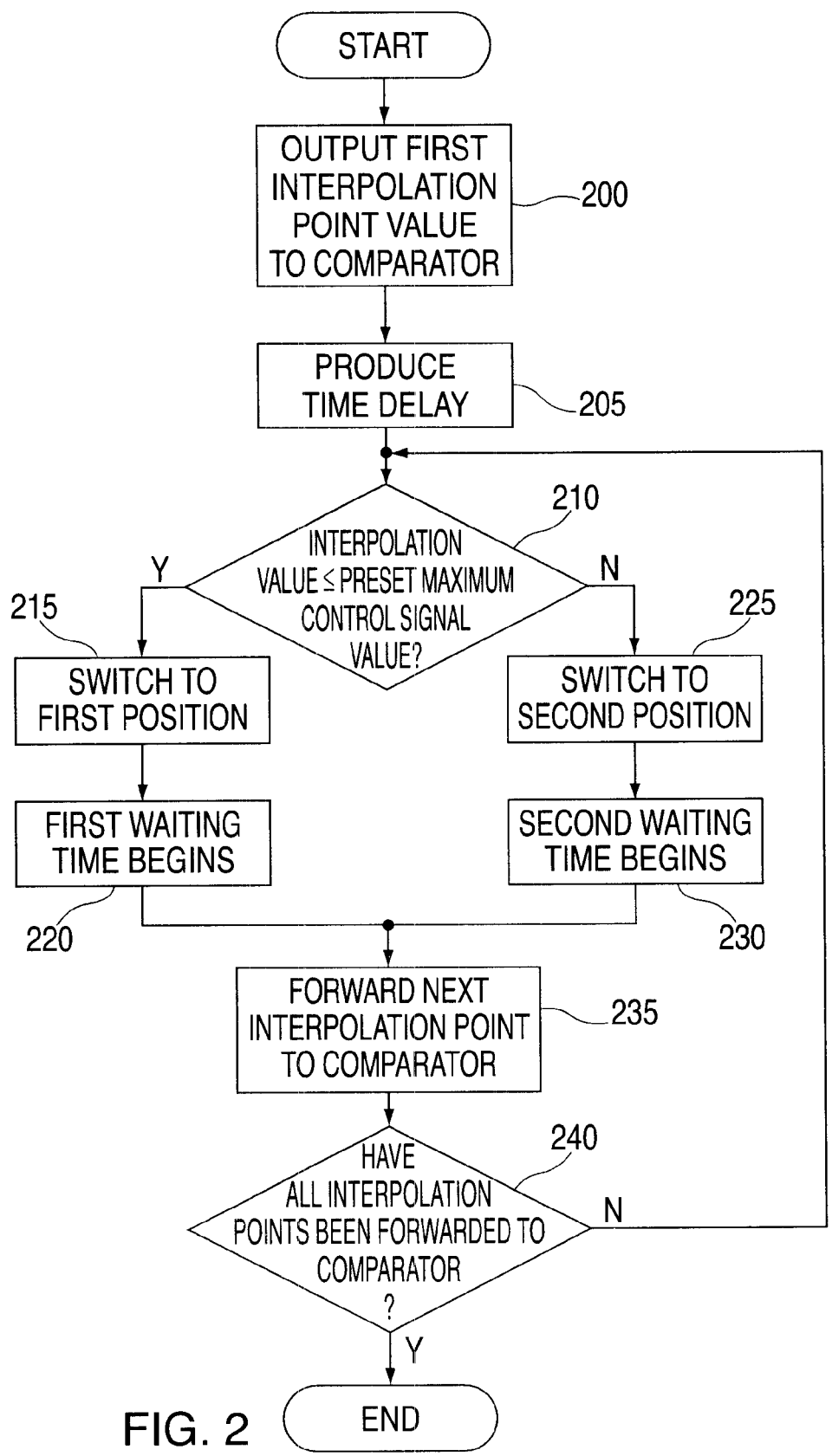
FIG. 2 shows a flow chart for selecting the control signal according to the first embodiment.

FIG. 2 shows a flow chart for generating the given control signal at the non-negated input (+) of summation point 45. In a program step 200, the first interpolation point value of reference control signal 5 is output to comparator 55 from memory 70. As shown in FIG. 3, this value is equal to zero.

In a program step 205, a time delay 15, 16 is produced. Time delay 15, 16 is stored in memory 70. This time delay is selected as a function of the target transmitter control requirements according to the specification based on the GSM standard. In step 210, the program checks whether the interpolation value of reference control signal 5 supplied to comparator 55 from memory 70 is less than or equal to preset maximum control signal value 6, 7. If so, the program branches to step 215; if not, it branches to step 225. In program step 215, switch 50 is placed in a first position, which is illustrated by the broken lines in FIG. 1, unless switch 50 is already in its first position. When switch 50 is in its first position, the output of first digital-analog converter 60 is connected to the non-negated input (+) of summation point 45, thus providing the interpolation value as the control signal for power amplifier 10. The program then branches to step 220. In program step 220, a first waiting time begins, which corresponds to first interval 90. In program step 225, switch 50 is placed by comparator 55 in the second switch position, which is represented by a solid line in FIG. 1, in this case, connecting the output of second digital-analog converter 65 to the non-negated input (+) of summation point 45 so that preset maximum control signal value 6, 7 is used as control signal $U_c$ for power amplifier 10. The switching of switch 50 is detected at first input 110 of memory 70. In program step 230, a second waiting time begins as a function of preset maximum control signal value 6, 7 supplied to second input 115 of memory 70, with this second waiting time being equal to the first waiting time only when preset maximum control signal value 6, 7 assumes value $U_{c0}$. The program branches to step 235 from step 220 and step 230. In program step 235, the next interpolation point of reference control signal 5 is forwarded from memory 70 to comparator 55. In step 240, the program checks whether all interpolation points have been forwarded from memory 70 to comparator 55. If so, the sequence ends; if not, the program branches back to step 210. If the switching of switch 50 from its second position to its first position is detected in memory 70, the first waiting time begins again as the interval for outputting the interpolation points from memory 70. Delays 15, 16, which began in program step 205, are also stored in memory 70 and assigned to preset maximum control signal values 6, 7. As the output power levels defined at input unit 75 decrease, increasing preset time delays 15, 16 are assigned to resulting preset maximum control signal values 6, 7 in memory 70. With a first preset maximum control signal value 6, this yields a first time delay 15 that is shorter than second time delay 16 for second preset maximum control signal value 7. Consequently, control signal 8 obtained for first preset maximum control signal value 6 according to FIG. 3 begins at a time $t_2$ that is offset from time $t_1$ by first preset time delay 15, compared to reference control signal 5. As shown in FIG. 3, control signal 9 obtained for second preset maximum control signal 7 begins at a time $t_3$ that is offset from time $t_1$ of reference control signal 5 by an even greater amount than time $t_2$. Preset time delays 15, 16 are selected to meet all requirements of the specification based on the GSM standard, so that, for example, all resulting control signals 8, 9 reach their maximum values at a time $t_4$. This is important insofar as time templates, in which the high-frequency transmitted signals are to be output at the preset power level, are provided for outputting transmitted signal, for example, based on the GSM mobile radio standard. By using the interpolation points of reference control signal 5 for measuring control signal 8, 9, all control signals 8, 9 have the same curve shape for rising up to their maximum values. The same applies when the signal amplitude of control signal 8, 9 decreases to 0. Because the same first interval 90 is provided for the rise and fall of control signal 8, 9 between the individual interpolation points, the interval between the interpolation points must be reduced as preset maximum control signal value 6, 7 decreases when control signal 8, 9 assumes its maximum value so that all interpolation values stored in memory 70 can be supplied to comparator 55 for generating control signal 8, 9. As shown in FIG. 3, this yields control signal 8 for first preset maximum control signal value 6 at which the second waiting time between two interpolation points is equal to a second interval 95, which is shorter than first interval 90, when maximum control signal value $U_{c1}$ is reached. For second preset maximum control signal value 7, this yields control signal 9 at which the second waiting time between two interpolation points corresponds to a third interval 100, which is shorter than second interval 95, when maximum control signal value $U_{c2}$ is reached. The second waiting time is selected so that all control signals 8, 9 reach their maximum values at a time $t_5$ and decrease from time $t_5$ onward. From time $t_5$ onward, the first waiting time between two interpolation points, which corresponds to first interval 90, starts all over again for all control signals 8, 9. In this manner, control signal 9 with maximum value $U_{c2}$ reaches an amplitude value of zero at a time $t_6$, from which time $t_8$ for the zero passage of reference control signal 5 is offset by second preset time delay 16. Control signal 8 with maximum value $U_{c1}$ reaches an amplitude value of 0 at a time $t_7$, from which time $t_8$ for the zero passage of reference control signal 5 is offset by first preset time delay 15.

First and second filters 35 and 40 can also be used to stabilize the control circuit, preventing, for example, oscillations from occurring. The high-frequency output power actually achieved at antenna feed-in point 30 is measured with the aid of detector 20 and returned to the control loop of power amplifier 10 in the form of a controlled variable via the negated input (−) of summation point 45.

To save locations in memory 70, groups of adjacent preset maximum control signal values can each be assigned a preset time delay. The resulting variations of time $t_4$ for reaching the maximum amplitude of control signal $U_c$ must lie within a preset tolerance range, for example, according to the GSM mobile radio standard. The components of the control circuit shown in FIG. 1 must be carefully dimensioned so that all requirements of defined specifications, such as those of the GSM mobile radio standard, are met with regard to the time requirements for the high-frequency transmitted signal and the spectral width of the transmitted signal at all preset output power levels.

Figure 4:
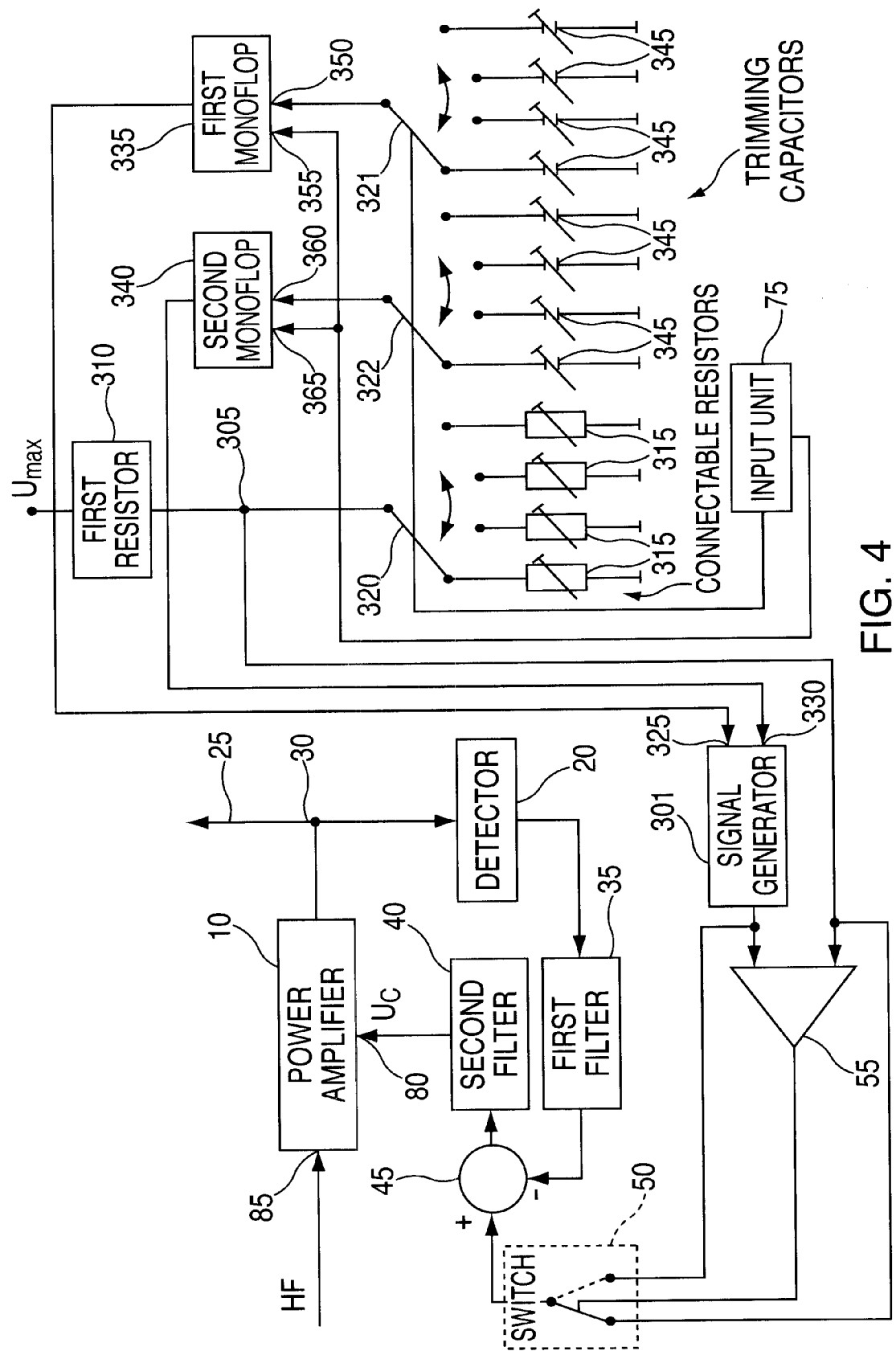
FIG. 4 shows a block diagram of a second embodiment.
Figure 5:
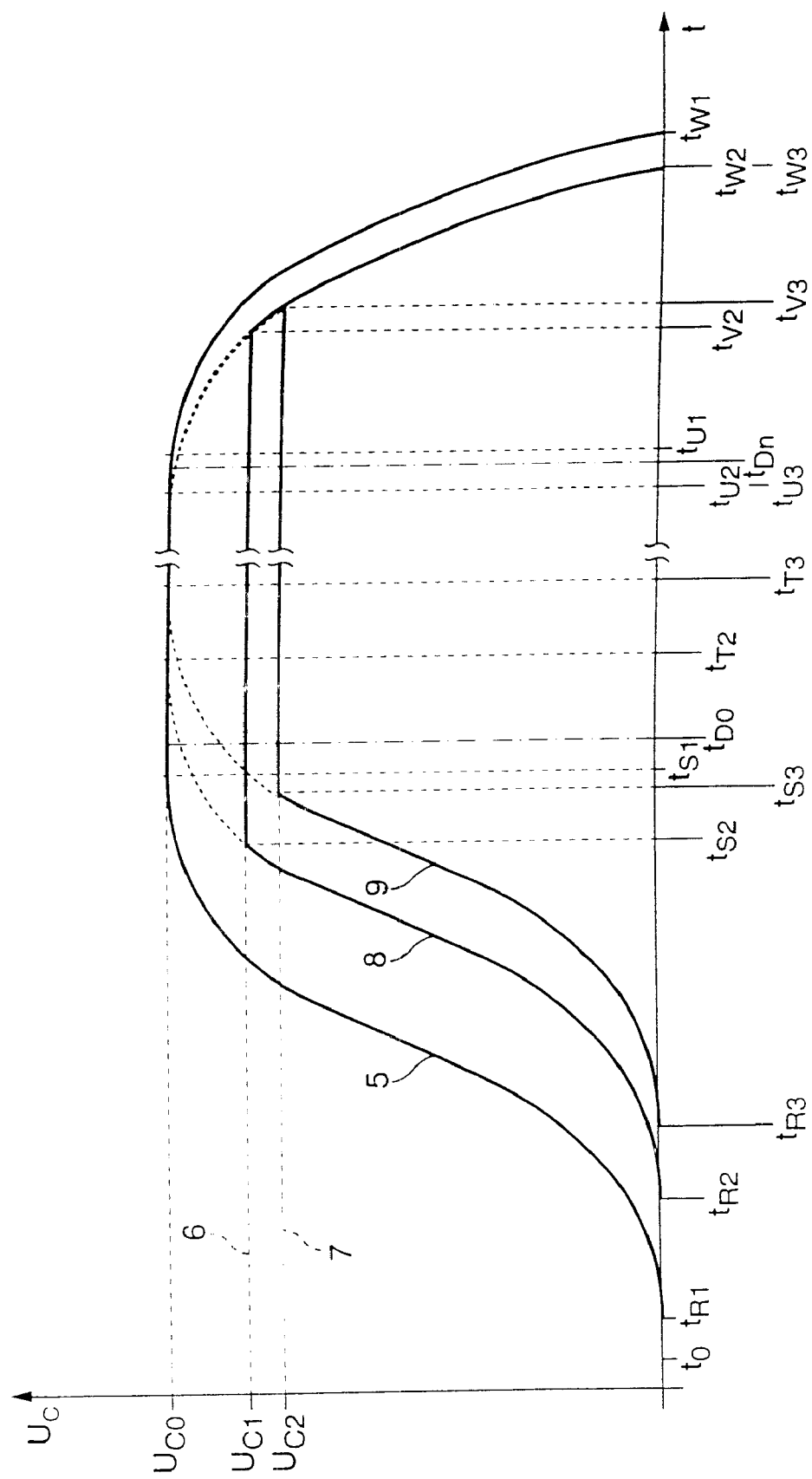
FIG. 5 shows a variation over time of three control signals according to the second embodiment.

FIG. 4 shows a further embodiment of the method according to the present invention. It is based on the block diagram illustrated in FIG. 1. The same parts are identified by the same reference numbers. The control circuit has the same design as the one in FIG. 1. However, the control signal provided at the non-negated input (+) of summation point 45 is generated differently. The non-negated input (+) of summation point 45 is connected to switch 50. The non-negated input (+) of summation point 45 can be connected via switch 50 either to the output of a signal generator 301 for generating control signal 5 or to middle tapping point 305 of a switchable voltage divider composed of a first resistor 310 and a second connectable resistor 315. First resistor 310 of the voltage divider is connected to a first potential $U_{max}$, and second resistor 315 of the voltage divider is connected to a reference potential. Three further resistors 315 can be connected via a first actuator 320 to middle tapping point 305 of the voltage divider in the form of second connectable resistors of the voltage divider. Connectable resistors 315 of the voltage divider are designed as trimming potentiometers. The position of switch 50 is controlled by the output of comparator 55 having two inputs which are also connected to the output of signal generator 301 or middle tapping point 305 of the voltage divider. Signal generator 301 has a first input 325 and a second input 330. First input 325 is connected to the output of a first monoflop 335, and second input 330 is connected to the output of a second monoflop 340. A first input 350 of first monoflop 335 can be connected via a second actuator 321 to one of four trimming capacitors 345, with the electrodes of these capacitors that are not connected to third actuator 322 being also connected to the reference potential. A first input 360 of second monoflop 340 can also be connected, via third actuator 322, to one of four additional trimming capacitors 345, whose electrodes that are not connected to third actuator 322 are also connected to reference potential. A second input 355 of first monoflop 335 and a second input 322 of second monoflop 340 are connected to an input unit 75 which also controls the switch positions of actuators 320, 321, and 322. Connectable resistors 315 and trimming capacitors 345 are used as storage units for storing parameter sets. Each parameter set includes a preset maximum control signal value 6, 7, a first time constant for the signal rising time delay, and a second time constant for the signal falling time delay, so that both preset time delays 15, 16 can be different for the signal rise and the signal fall. In this embodiment, preset maximum control signal value 6, 7 is stored as a setting of corresponding connectable resistor 315, which is designed as a trimming potentiometer, so that the signal voltage needed for setting preset maximum control signal value 6, 7 is supplied to comparator 55 at middle tapping point 305 of the voltage divider. In a similar manner, the values for time delays 15, 16 are stored by trimming capacitors 345, with trimming capacitors 345 that can be connected to first monoflop 335 defining the time constant of first monoflop 335, and trimming capacitors 345 that can be connected to second monoflop 340 defining the time constant for second monoflop 340. Switching from one parameter set to another parameter set takes place synchronously via input unit 370, which switches actuators 320, 321, 322 simultaneously. Second input 355 of first monoflop 335 and second input 365 of second monoflop 340 are activated by input unit 75 at time $t_0$, as shown in FIG. 5. This initiates the output of a transmitted signal. At the end of a first waiting time $t_R$, first monoflop 335 activates first input 325 of signal generator 301, which subsequently outputs the rising edge of reference control signal 5 in analog form as a continuous signal at its output and remains in this state upon reaching the maximum value of this reference control signal 5 until second monoflop 340 expires at the end of a second waiting time $t_U$ and initiates the start of the signal fall via second input 330 of signal generator 301. FIG. 5 shows the voltage variation of three control signals $U_c$ over time t. Reference control signal 5 generated by signal generator 301 is used to generate the maximum transmission level. If maximum control signal value 6, 7 set using corresponding trimming potentiometer 315 is greater than or equal to maximum value $U_{c0}$ of reference control signal 5, switch 50 always remains in the position that connects the output of signal generator 301 to summation point 45. Parameter sets can be selected via actuators 320, 321, 322 at input unit 75, and the values of connectable resistors 315 and trimming capacitors 345 can also be set at input unit 75. Input unit 75 is also used to start a transmission operation so that both monoflops 335, 340 are activated at time $t_0$. The setting of maximum presettable control signal values 6, 7 depends on first potential $U_{max}$, the reference potential, first resistor 310 of the voltage divider, selected connectable resistor 315, and its resistance. When a parameter set having a preset maximum control signal value 6, 7 that is less than maximum value $U_{c0}$ of reference control signal 5 is selected at input unit 75, the level of control signal 8, 9 reaches the value of preset maximum control signal value 6, 7 at a tame $t_s$, as shown in FIG. 5. If this value is exceeded, comparator 55 switches switch 50 so that middle tapping point 305 of the voltage divider is connected to summation point 45 instead of the output of signal generator 301. Switch 50 remains in this position until a time $t_v$ because control signal 8, 9 drops below the value of preset maximum control signal value 6, 7 at this time, and comparator 55 resets switch 55 to the position which connects the output of signal generator 301 to summation point 45. Control signal 8. 9 then returns to a value of zero at time $t_W$.

FIG. 5 shows reference control signal 5, which begins at time $t_{R1}$, initiated by first monoflop 335, and reaches its maximum value $U_{c0}$ at a time $t_{S1}$. From a time $t_{D0}$ onward, which follows time $t_{S1}$, the corresponding high-frequency transmitted signal must be output at the preset maximum power according to the time templates of the GSM mobile radio standard. This must be maintained until a time $t_{Dn}$ which follows time $t_{D0}$, according to the GSM mobile radio standard. At a time $t_{U1}$, which follows time $t_{Dn}$, second monoflop 340 causes reference control signal 5 to begin falling so that it again crosses the zero axis at time $t_{W1}$. If a value $U_{c1}$ that is less than $U_{c0}$ is set at input unit 75 for first preset maximum control signal value 6, and if corresponding time constants are selected accordingly for both monoflops 335, 340, first monoflop 335 causes first control signal 8 to begin at a time $t_{R2}$ which is offset from time $t_{R1}$, with the control signal taking on the form of reference control signal 5 at time $t_{S2}$. Value $U_{c1}$ is reached at time $t_{S2}$, with this time occurring before time $t_{S1}$. This means that the maximum preset transmission power also begins at time $t_{D0}$. The broken line in FIG. 5 shows the continued variation of first control signal 8 until it reaches value $U_{c0}$, which would take place at a time $t_{T2}$ occurring after time $t_{T0}$. Second monoflop 340 causes reference control signal 5 generated by signal generator 301 to begin to decrease at time $t_{U2}$, which occurs before time $t_{Dn}$, so that it reaches value $U_{c1}$ at a time $t_{V2}$, which occurs after time $t_{Dn}$, so that first control signal 8 supplied to summation point 45 remains at value $U_{c1}$ until time $t_{V2}$ and decreases from time $t_{V2}$ onward according to the variation of reference control signal 5, reaching the zero axis at time $t_{W2}$. In this case, the transmitted signal is therefore also output at the preset maximum level between time $t_{D0}$ and time $t_{Dn}$.

The same applies to second control signal 9 according to FIG. 5, which has a maximum value of $U_{c2}$ and which is initiated by first monoflop 335 at a time $t_{R3}$, which is offset from time $t_{R2}$ with the signal rising to its maximum value $U_{c2}$ according to the variation of reference control signal 5 and reaches the maximum value at a time $t_{S3}$ which occurs between time $t_{S1}$, and time $t_{S2}$, at which point second monoflop 340 causes reference control signal 5 generated by signal generator 301 to fall at a time $t_{U3}$ which is equal to time $t_{U2}$, with the signal reaching value $U_{C2}$ at a time $t_{V3}$ which is offset from time $t_{V2}$, and second control signal 9 decreases to zero from time $t_{V3}$ according to the variation of reference control signal 5, reaching zero at time $t_{W3}$, which is equal to time $t_{W2}$. In this case, as well, the continued variation of second control signal 9 until reaching maximum possible value $U_{c0}$ is represented by a broken line, with value $U_{c0}$ being reached at a time $t_{T3}$, which is offset from time $t_{T2}$. The fall of reference control signal 5 generated by signal generator 301 from its maximum value $U_{c0}$ to preset maximum control signal value 6, 7 is also shown by a broken line in FIG. 5. Even if second maximum control signal value 7 having a value $U_{c2}$ is set, second control signal 9 supplied to summation point 45 retains this value until time $t_{V3}$. The curves shown by the broken lines in FIG. 5 represent the control signals generated by signal generator 301 which do not reach summation point 45 due to the position of switch 50. The actual data output takes place between time $t_{D0}$ and time $t_{Dn}$.

Generating control signal 8, 9 using a hardware circuit without any digital storage of interpolation points, as shown in FIG. 4, has the advantage that it eliminates arithmetic operations and simplifies signal filtering because there is no digital-analog conversion, which means that no unwanted signals are produced due to digital-analog converter clocking.

The arrangement described here can be, for example, part of a mobile radio transmitter based on the GSM standard. GSM mobile radio specifications contain requirements for the time sequence of the transmitted signal rise and fall for various levels of the transmission output power. They also contain requirements relating to the permitted width of the transmitted frequency spectrum. Compliance with these requirements must be ensured at all output power levels by selecting time delays $t_R$ and $t_U$ and by carefully dimensioning filters 35 and 40.

Figure 6:
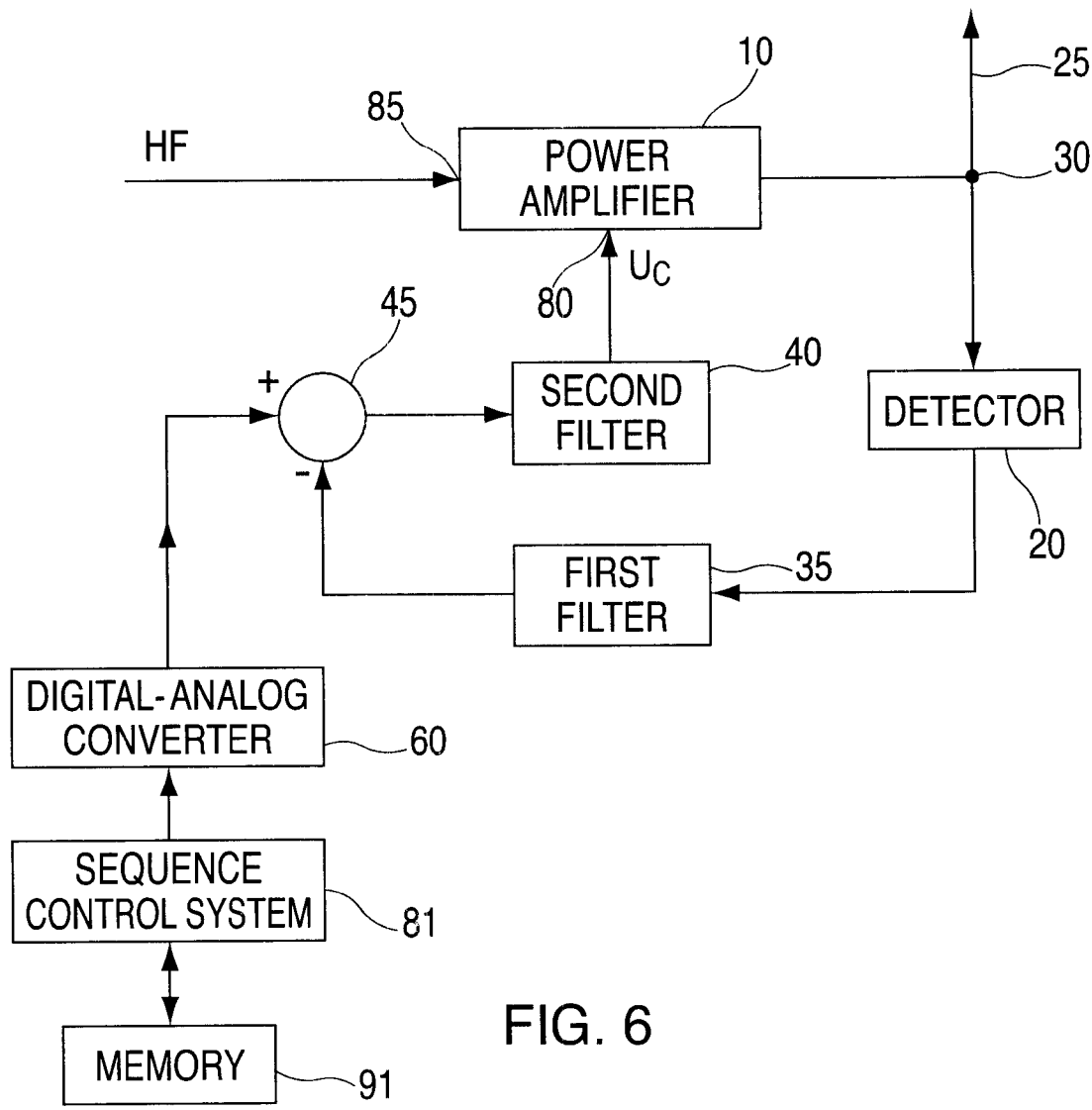
FIG. 6 shows a block diagram of a third embodiment.

In a further embodiment illustrated in FIG. 6, the control circuit still remains the same as the one in the embodiment shown in FIG. 1. However, a different implementation was selected for generating the control signal supplied to the non-negated input (+) of summation point 45. In this case, the output of a digital-analog converter 60, which receives the digital value of the analog control signal to be output from a sequence control system 81, is connected to the non-negated input (+) of summation point 45. Sequence control system 81, which can be designed, for example, as a microcomputer, can access the contents of a data memory 91 in which are stored the interpolation points of reference control signal 5 and various parameters for generating control signals 8, 9 to be derived from reference control signal 5 for different presettable maximum control signal values 6, 7. In doing this, it is assumed that m different power levels can be set for outputting transmitted signals via transmission antenna 25. For each of the m possible power levels, one value for the time delay at the beginning of transmission, one value for preset maximum control signal value 6,7 of control signal 8, 9 needed for this power level, and a number of interpolation values to be skipped when corresponding control signal 8, 9 decreases are stored in data memory 91.

Figure 7A:
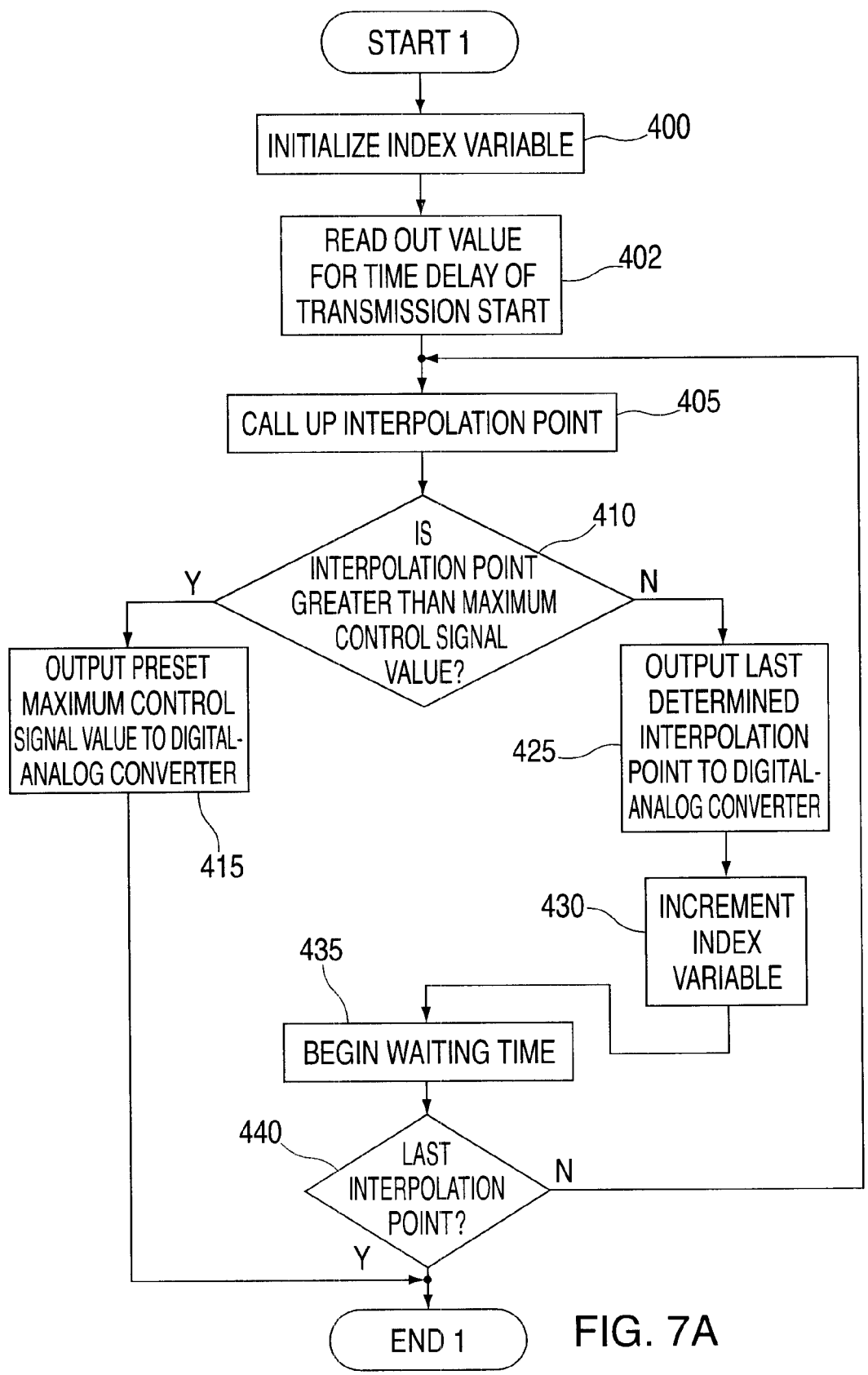
FIG. 7 shows two flow charts for the third embodiment.
Figure 7B:
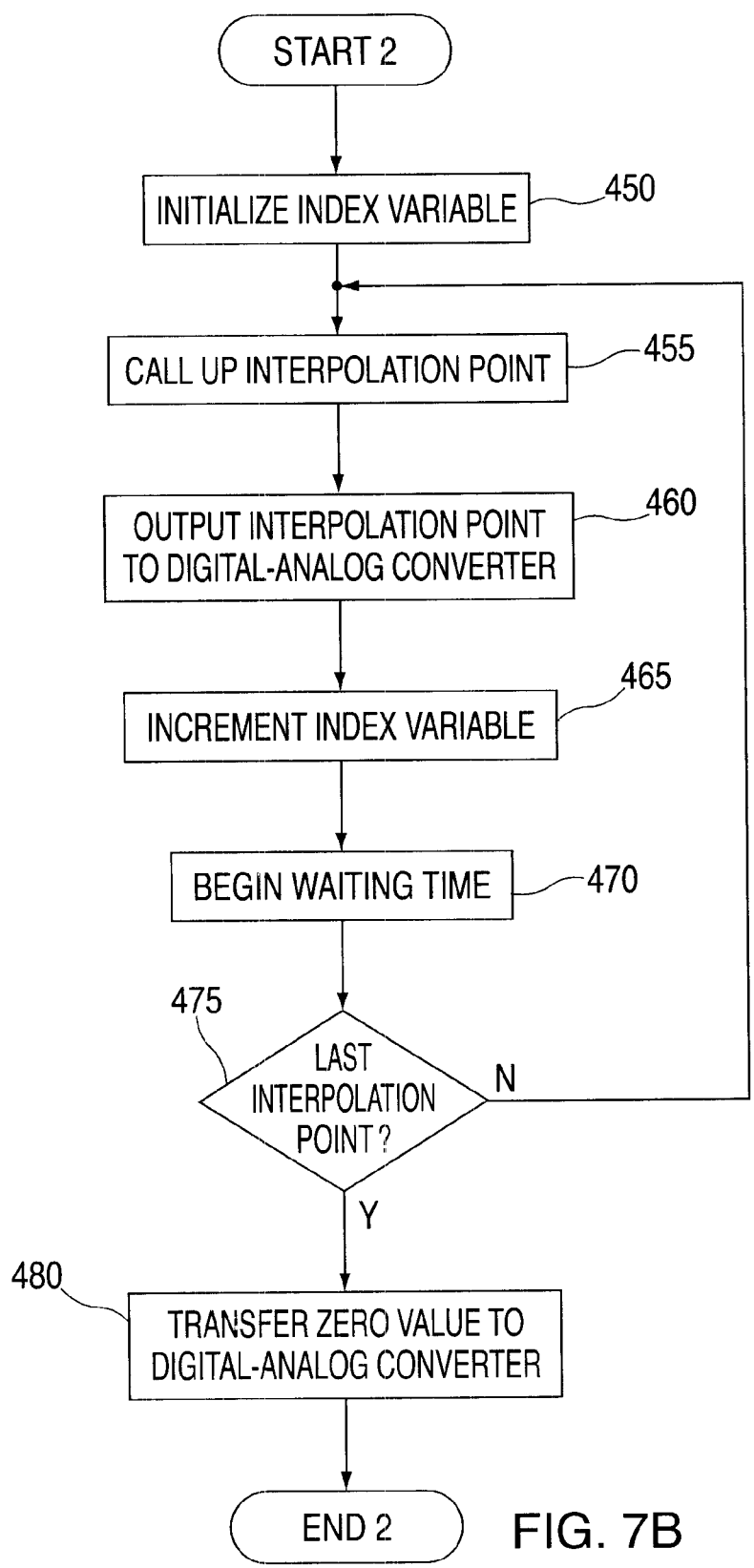
Figure 8:
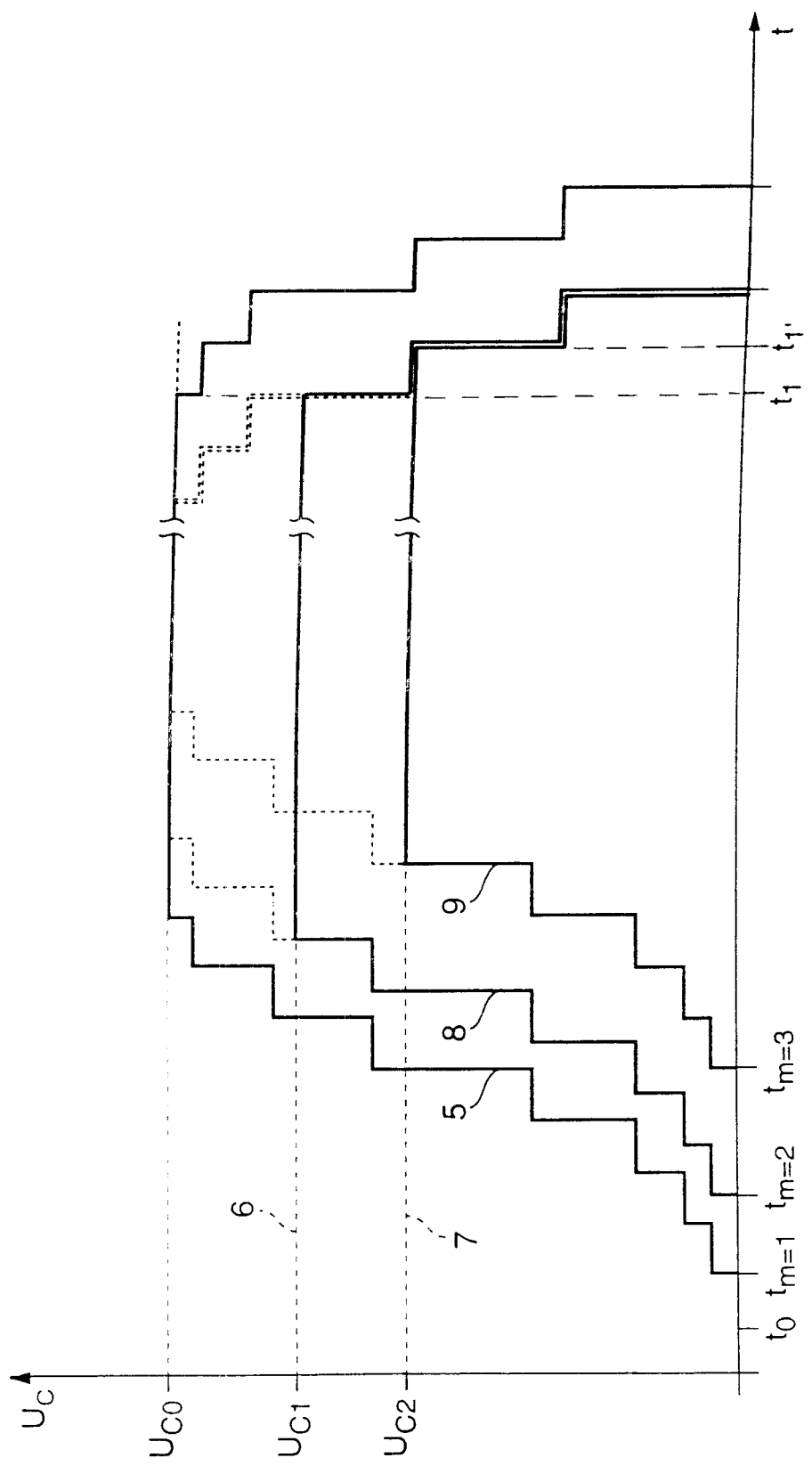
FIG. 8 shows a variation over time of three control signals according to the third embodiment.

FIG. 7 shows two flow charts for generating control signal 8 needed for a desired transmission output power. FIG. 8 shows the variation of the voltages of control signals 8, 9 over time t for three power levels of the transmitter output signal. Values $U_{c1}$ and $U_{c2}$ shown in FIGS. 3 and 5 were again selected for maximum preset control signal values 6, 7. Maximum value $U_{c0}$ for reference control signal 5 is also selected as illustrated in FIGS. 3 and 5. A first sequence of interpolation points of reference control signal 5 is called up in program step START 1 at a time $t_0$ prior to the beginning of the transmitted signal rise. During this call, the program receives a value m for the desired power level of the transmitter output power, with the base station transmitting this value by radio to sequence control system 81. In program step 400, access to the first interpolation point, stored in data memory 91, of the first sequence of reference control signal 5 is prepared by initializing an index variable. In program step 402, the value for the time delay of transmission start $t_m$, which is stored for level m, is read out from data memory 91. At the end of waiting time $t_m$, the interpolation point referenced by the index variable is called up from data memory in program step 405. In program step 410, a comparison is carried out to check whether this interpolation point is greater than maximum control signal value 6, 7 defined for transmission power m. If so, the program branches to step 415; if not, it branches to step 425.

In program step 425, preset maximum control signal value 6, 7 for transmission power m is output to digital-analog converter 60, and the program sequence is terminated.

In program step 425, the last determined interpolation point of reference control signal 5 is output to digital-analog converter 60. In program step 430, the index variable is incremented so that it points to the next interpolation point to be output. A waiting time, which is constant for all program calls and passes and is determined by the desired clock rate for interpolation point output, begins in program step 435. In step 440, the program checks whether the value just output to digital-analog converter 60 was the last interpolation point for the power increase, which means that maximum value $U_{c0}$ of reference control signal 5 has been reached. If so, the program sequence ends; if not, the program branches to step 405 and calls up the next interpolation point.

At a time $t_1$, or $t_1'$, the decrease in transmission power begins, as shown in FIG. 8, in that a second sequence of interpolation points of reference control signal 5 is called up in program step START 2. In this call as well, the base station transmits value m for the current power level of the transmitter output power to sequence control system 81 by radio. In program step 450, the index variable containing the number, incremented by 1, of the interpolation points of reference control signal 5 to be skipped at this power level m is initialized so that it now points to the first interpolation point of reference control signal 5 corresponding to preset maximum control signal value 6, 7. In program step 455, the interpolation point referenced by the index variable is called up from data memory 91. In program step 460, this interpolation point of reference control signal 5 is output to digital-analog converter 60. In program step 465, the index variable is incremented, and a waiting time, which remains the same for all program passes, begins in program step 470. At the end of this waiting time, the program checks, in step 475, whether the interpolation point just output was the last value of reference control signal 5. If so, the program branches to step 480; if not, it branches to step 455 and calls up the next interpolation point. In program step 480, the value zero is transferred to digital-analog converter 60, and the program ends.

FIG. 8 shows the variation of the voltage of control signals $U_c$ over time t for m=3 power levels of the transmitter output signal. With a signal rise to the maximum transmitter output power according to maximum value $U_{c0}$ of reference control signal 5, all interpolation points of reference control signal 5 are used, i.e., they are output to the non-negated input (+) of summation point 45 in the power control circuit via digital-analog converter 60. This yields the voltage variation identified by reference number 5 for the reference control signal at the output of digital-analog converter 60. Reference control signal 5 begins at a time $t_{m=1}$ that is offset from time $t_0$. Low power levels of the required transmitter output power yield the voltage variations for control signals 8, 9 shown in FIG. 5. First control signal 8 begins at a time $t_{m=2}$, which is offset from time $t_{m=1}$, and reaches maximum preset value $U_{c1}$. Second control signal 9 begins at a time $t_{m=3}$, which is offset from time $t_{m=2}$, and reaches maximum preset value $U_{c2}$, with value $U_{c2}$ being less than value $U_{c1}$, and value $U_{c1}$ being less than value $U_{c0}$ according to the previous embodiments. The interpolation points represented by the dotted lines in FIG. 8 are not carried out when the transmitter output power increases with control signals 8, 9 having maximum values $U_{c1}$ and $U_{c2}$ and are skipped when the power decreases.

The decrease in transmitter output power then begins at time $t_1$ for reference control signal 5 and first control signal 8 or at time $t_1'$, which is offset from time $t_1$, for second control signal 9.

The voltage levels of control signal 8, 9 arriving from digital-analog converter 60 are smoothed by second filter 40 and converted to a continuously rising or falling voltage variation.

The circuit described above is used as illustrated in FIG. 6 in a further embodiment. In the flow chart for sequence control system 81 illustrated in FIG. 9, however, only one sequence of interpolation points of reference control signal 5 is executed, which is initiated at the beginning of the transmitted signal rise and terminated only at the end of the transmitted signal fall. Five parameters are stored in data memory 91 for each of the m possible power levels: preset maximum control signal value 6, 7 of control signal 8, 9 needed for this power level and four waiting times between the output of interpolation points to digital-analog converter 60. A first waiting time $t_{m1}$ applies to the time delay at the beginning of transmission, a second waiting time $t_{m2}$ applies to the period of transmitter output power increase, a third waiting time $t_{m3}$ applies to the period of constant maximum transmitter output power, and a fourth waiting time $t_{m4}$ applies to the period of transmitter output power decrease.

FIG. 10 shows the variation of resulting control signals $U_c$ for two power levels m of the transmitter output power over time t.

At time $t_0$ before the transmitted signal begins to rise, the sequence of interpolation points is called up in program step START. With this call, sequence control system 81 receives value m for the desired power level of the transmitter output power by radio from a base station. In program step 500, access to the first interpolation point of reference control signal 5 is prepared by initializing a first index variable $Z_1$. In program step 501, a second index variable $Z_2$ is initialized so that it points to first waiting time $t_{m1}$ for selected power level m of the transmitter output power. In program step 502, first waiting time $t_{m1}$ referenced by second index variable $Z_2$ is called up from data memory 91. At the end of first waiting time $t_{m1}$ second index variable $Z_2$ is set in program step 503 so that it now points to second waiting time $t_{m2}$ of selected power level m.

In program step 505, the interpolation point referenced by first index variable $Z_1$ is called up from data memory 91. In program step 510, a comparison is carried out to check whether this interpolation point is greater than or equal to preset maximum control signal value 6, 7 of selected power level m. If so, the program branches to step 515; if not, it branches to step 540. In program step 515, preset maximum control signal value 6, 7 for selected power level m is output to digital-analog converter 60. In program step 520, second index variable $Z_2$ is subsequently set so that it points to third waiting time $t_{m3}$ of selected power level m. In program step 525, third waiting time $t_{m3}$ referenced by second index variable $Z_2$ is called up from data memory 91. At the end of third waiting time $t_{m3}$, second index variable $Z_2$ is set to fourth waiting time $t_{m4}$ of selected power level m in program step 530. Program step 550 is carried out next.

In program step 540, the interpolation point called up in program step 505 is output to digital-analog converter 60. In program step 545, the waiting time referenced by second index variable $Z_2$ is called up. This waiting time can be either second waiting time $t_{m2}$ or fourth waiting time $t_{m4}$ for selected power level m, depending on whether or not the program previously branched from step 515. Program step 550 is carried out next. In program step 550, a first index variable $Z_1$ is incremented. It now points to the next interpolation point to be output. In step 555, the program checks whether the last available interpolation point was output, i.e., whether first index variable $Z_1$ points beyond the end of the field of stored interpolation points. If so, the program branches to step 560; if not, it branches to step 505, where it reloads the waiting interpolation point from data memory 91. In program step 560, a value of zero is sent to digital-analog converter 60, and the program ends.

FIG. 10 shows the variation of the voltage at the output of digital-analog converter 60 for two power levels m of the transmitter output power. In this case, reference control signal 5 is illustrated with maximum control signal value $U_{c0}$, while first control signal 8 is illustrated with maximum value $U_{c1}$ of first preset maximum control signal value 6, which is derived from reference control signal 5. Reference control signal 5 begins at a time that is offset from turn-on time $t_0$ by a first waiting time $t_{m1a}$, and the beginning of first control signal 8, which is derived from reference control signal 5, is offset from turn-on time $t_0$ by a first waiting time $t_{m1b}$. Waiting time $t_{m1b}$ for first control signal 8 derived from reference control signal 5 is longer than first waiting time $t_{m1a}$ for reference control signal 5. The second waiting time for the interval between two interpolation points of reference control signal 5 is identified by $t_{m2a}$ in FIG. 10 and is shorter than second waiting time $t_{m2b}$ for the interval between two interpolation points for first control signal 8 derived from reference signal 5 during the signal rise. While reference control signal 5 and first control signal 8 derived from reference control signal 5 are at their maximum values, the interval between two interpolation points corresponds to third waiting time $t_{m3a}$ in the case of reference control signal 5, while it corresponds to $t_{m3b}$ in the case of first control signal 8 derived from reference control signal 5. Third waiting time $t_{m3b}$ of first control signal 8 derived from reference control signal 5 is shorter than third waiting time $t_{m3a}$ of reference control signal 5. The interval between two interpolation points during the decrease in first control signal 8 derived from reference control signal 5 corresponds to fourth waiting time $t_{m4b}$ and is shorter than corresponding fourth waiting time $t_{m4a}$ of reference control signal 5. Waiting times $t_{m1}$ through $t_{m4}$ are selected so that all interpolation points of the sequence stored in data memory 91 are called up both for reference control signal 5 and for first control signal 8 derived from reference control signal 5. The choice of second and fourth waiting times $t_{m2}$ and $t_{m4}$ makes it possible to define the individual rate at which the power rises and falls for each power level m of the transmitter output power. Third waiting times $t_{m3}$ are dimensioned so that the interpolation points of a higher transmission power not needed during the period of constant maximum transmission power are called up but not forwarded to digital-analog converter 60 based on the level comparison so that the interpolation point needed at the desired time at which the level decrease begins is available for processing in data memory 91.

The times at which the interpolation points are forwarded to digital-analog converter 60 are identified by upper-case letters A, B, C, . . . , M below the time axis for both reference control signal 5 and first control signal 8.

Figure 9:
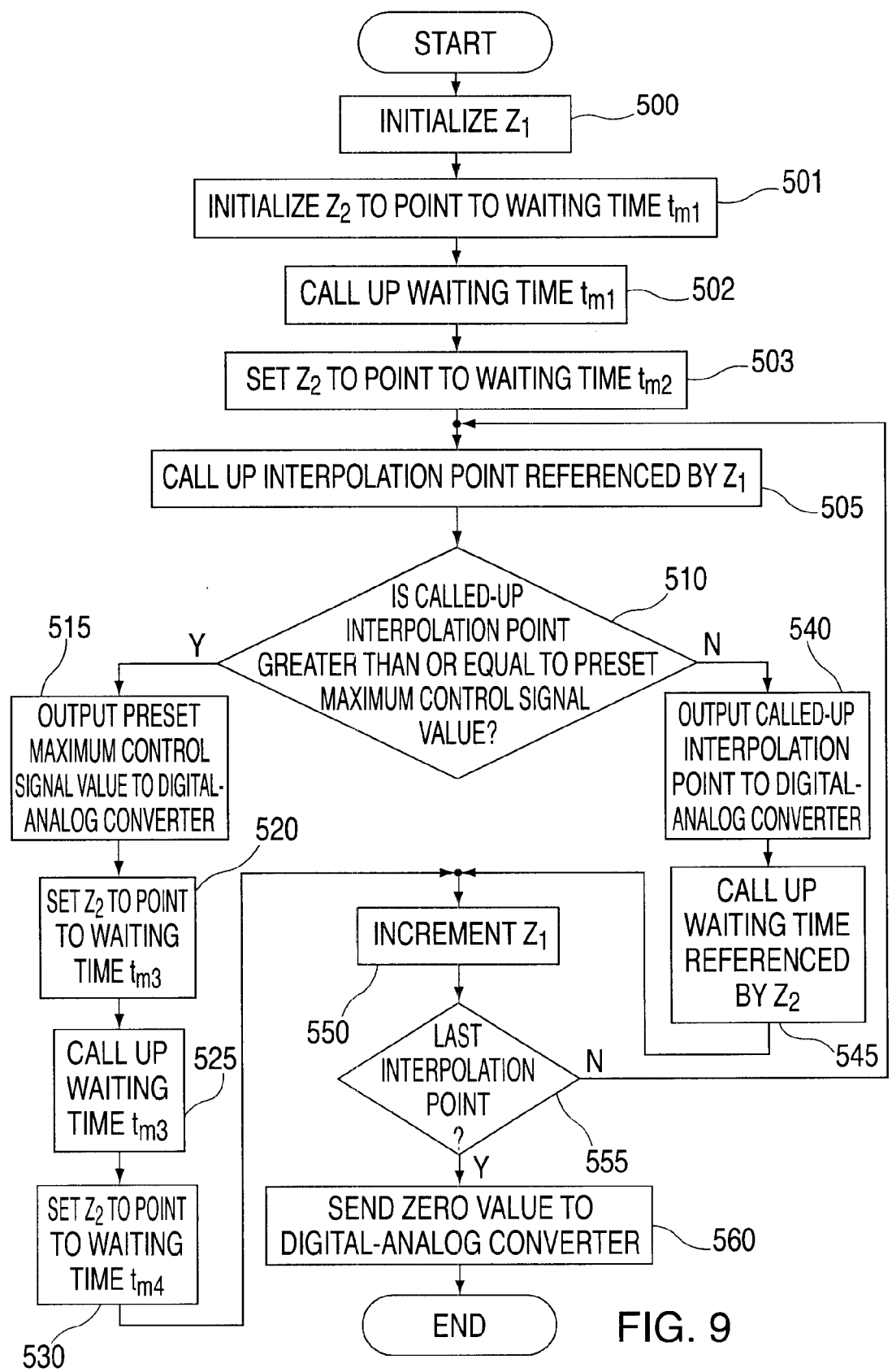
FIG. 9 shows the flow chart for a fourth embodiment.

According to the flow chart illustrated in FIG. 9, the program must branch to step 515 at all m power levels of the transmitter output power available in step 510 at the end of the transmitter signal rise so that third waiting time $t_{m3}$ of selected power level m can begin at the end of program step 520. This is a prerequisite for the subsequent transmitted signal fall with fourth waiting time $t_{m4}$. Because the interpolation point of reference control signal 5 corresponding to the maximum value of the selected power level cannot be greater than maximum presettable value $U_{c0}$ of reference control signal 5 (which is especially true for the power level with the highest possible transmitter output power), this interpolation point having maximum value $U_{c0}$ must be increased accordingly. This can be done, for example, by inserting a value (identified by reference number 395 in FIG. 10), which is not suitable for activating the control circuit and is much greater than maximum definable value $U_{c0}$ of reference control signal 5, between the area of transmitted signal rise and the area of transmitted signal fall in the table of interpolation points of reference control signal 5 stored in data memory 91.

During waiting times $t_{m1}$, $t_{m2}$, $t_{m3}$, $t_{m4}$, sequence control system 81 can be relieved from the program run and used to process other tasks.

Figure 11A:
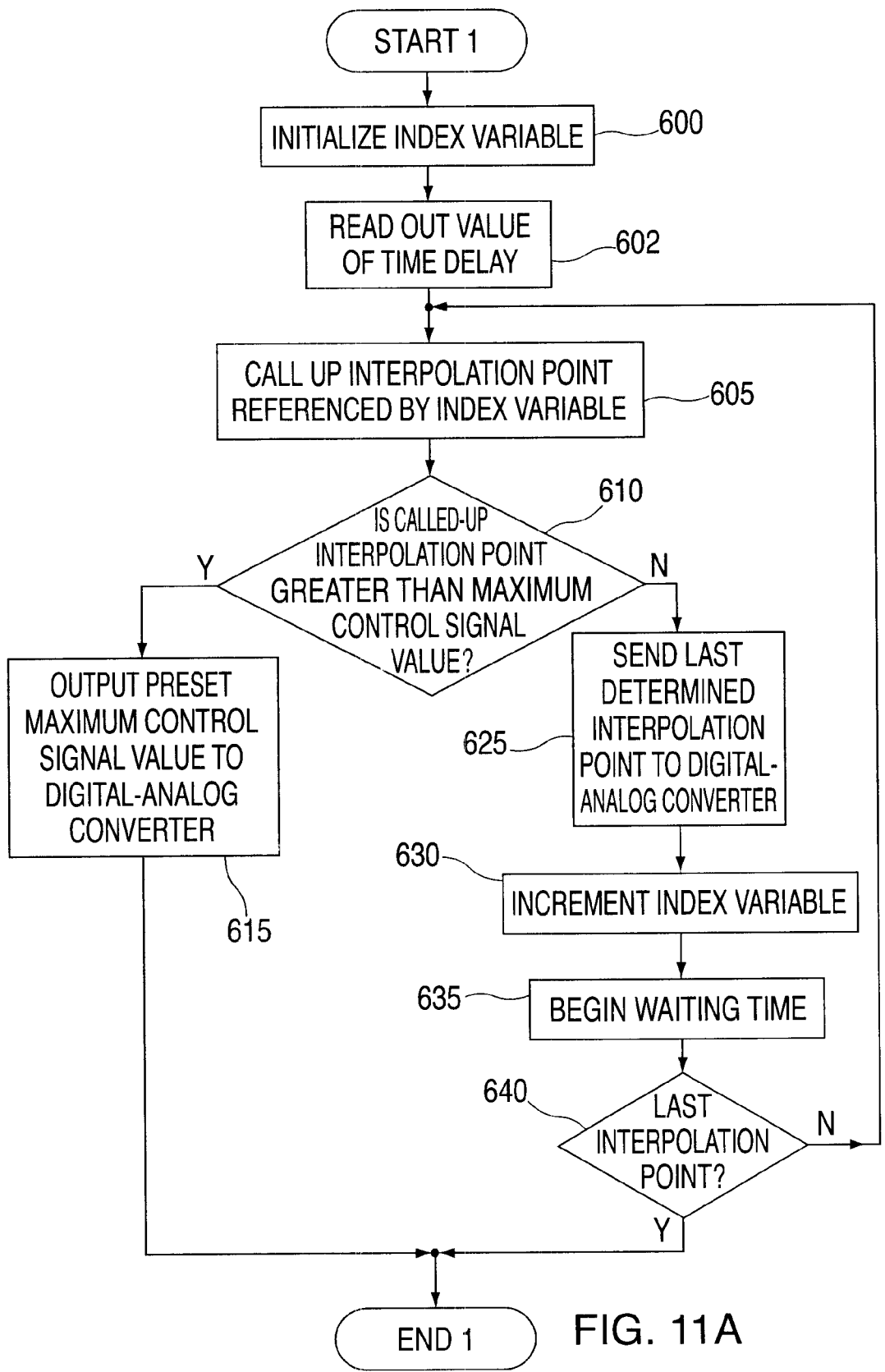
FIG. 11 shows two flow charts for a fifth embodiment.
Figure 11B:
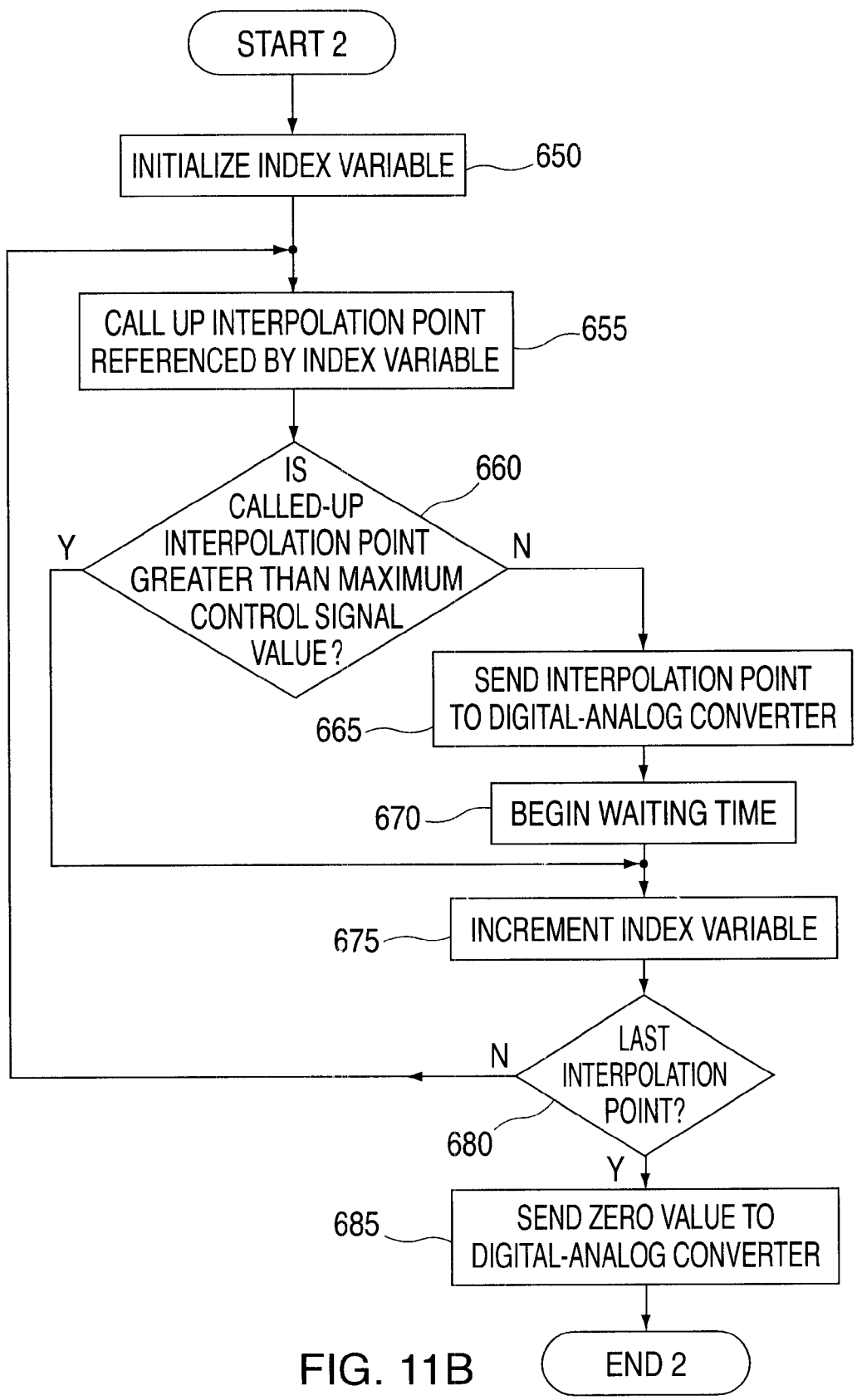

The circuit described above according to FIG. 6 is used in a further embodiment. FIG. 11 shows two flow charts for generating control signal 8, 9 needed for a desired transmitter output power. FIG. 12 shows the variation of the voltages of control signals 8, 9 over time t for three power levels of the transmitter output signal. Values $U_{c1}$ and $U_{c2}$ shown in FIGS. 3 and 5 were again selected for maximum presettable control signal values 6, 7. Maximum value $U_{c0}$ of reference control signal 5 shown in FIGS. 3 and 5 is also selected. A value for the time delay at the beginning of transmission and preset maximum control signal value 6, 7 of control signals 8, 9 needed for this power are stored in data memory 91 for each of the m possible power levels.

At a time $t_0$ before the transmitted signal rise begins, a first sequence of interpolation points of reference control signal 5 is called up in program step START 1. With this call, sequence control system 81 receives value m for the desired power level of the transmitter output power by radio from a base station. In program step 600, the access to the first interpolation point of the first sequence of reference control signal 5 stored in data memory 91 is prepared by initializing an index variable. In program step 602, the value for the time delay of transmission start $t_m$ stored for desired power level m is read out from data memory 91. At the end of waiting time $t_m$, the interpolation point referenced by the index variable is called up from data memory 91 in program step 605. In program step 610, a comparison is carried out to check whether this interpolation point is greater than maximum control signal value 6, 7 defined for desired power level m. If so, the program branches to step 615; if not, it branches to step 625. In program step 615, preset maximum control signal value 6, 7 is output to digital-analog converter 60 for desired power level m, and the program sequence ends.

In program step 625, the last determined interpolation point of reference control signal 5 is sent to digital-analog converter 60. In program step 630, the index variable is incremented so that it points to the next interpolation point to be output. A waiting time, which is constant for all program calls and passes and is determined by the desired clock rate for interpolation point output, begins in program step 635. In step 640, the program checks whether the value just output to digital-analog converter 60 was the last interpolation point for the power increase, which means that maximum value $U_{c0}$ of reference control signal 5 has been reached. If so, the program sequence ends; if not, the program branches to step 605 and calls up the next interpolation point.

At a time $t_1$ or $t_1'$, the decrease in transmission power begins, as shown in FIG. 12, in that a second sequence of interpolation points of reference control signal 5 is called up in program step START 2. In this call as well, value m for the current power level of the transmitter output power is transmitted to sequence control system 81. In program step 650, the index variable is initialized so that it points to the beginning of the second signal segment, i.e., to the first interpolation point of reference control signal 5 stored for the transmitted signal fall. However, the index variable initialization step can be omitted if the interpolation point from the first sequence is still stored in the corresponding memory cell and can be called up, provided that the interpolation points for the transmitted signal rise and fall are stored sequentially in data memory 91 in the form of an uninterrupted data field.

In program step 655, the interpolation point referenced by the index variable is called up from data memory 91. In step 660, the program checks whether this interpolation point is greater than maximum control signal value 6, 7 defined for preset power level m. If so, the program branches to step 675; if not, it branches to step 665. In program step 665, this interpolation point of reference control signal 5 is sent to digital-analog converter 60, and a waiting time, which remains constant for all passes of this program branch, is carried out in program step 670.

The index variable is incremented in program step 675. In step 680, the program checks whether the interpolation point last output was the last interpolation point of reference control signal 5. If so, the program branches to step 685; if not, it branches back to step 655 and calls up the next interpolation point. In program step 685, a value of 0 is transferred to digital-analog converter 60, and the program ends. FIG. 12 shows the variation in the voltage of control signals $U_c$ over time t for m=3 power levels of the transmitter output signal. The representation in FIG. 12 corresponds to the representation in FIG. 8, although the interpolation points represented by the dotted lines in this embodiment are not transmitted to digital-analog converter 60, based on the result of the level comparison, when the transmitter output power decreases.

Figure 13A:
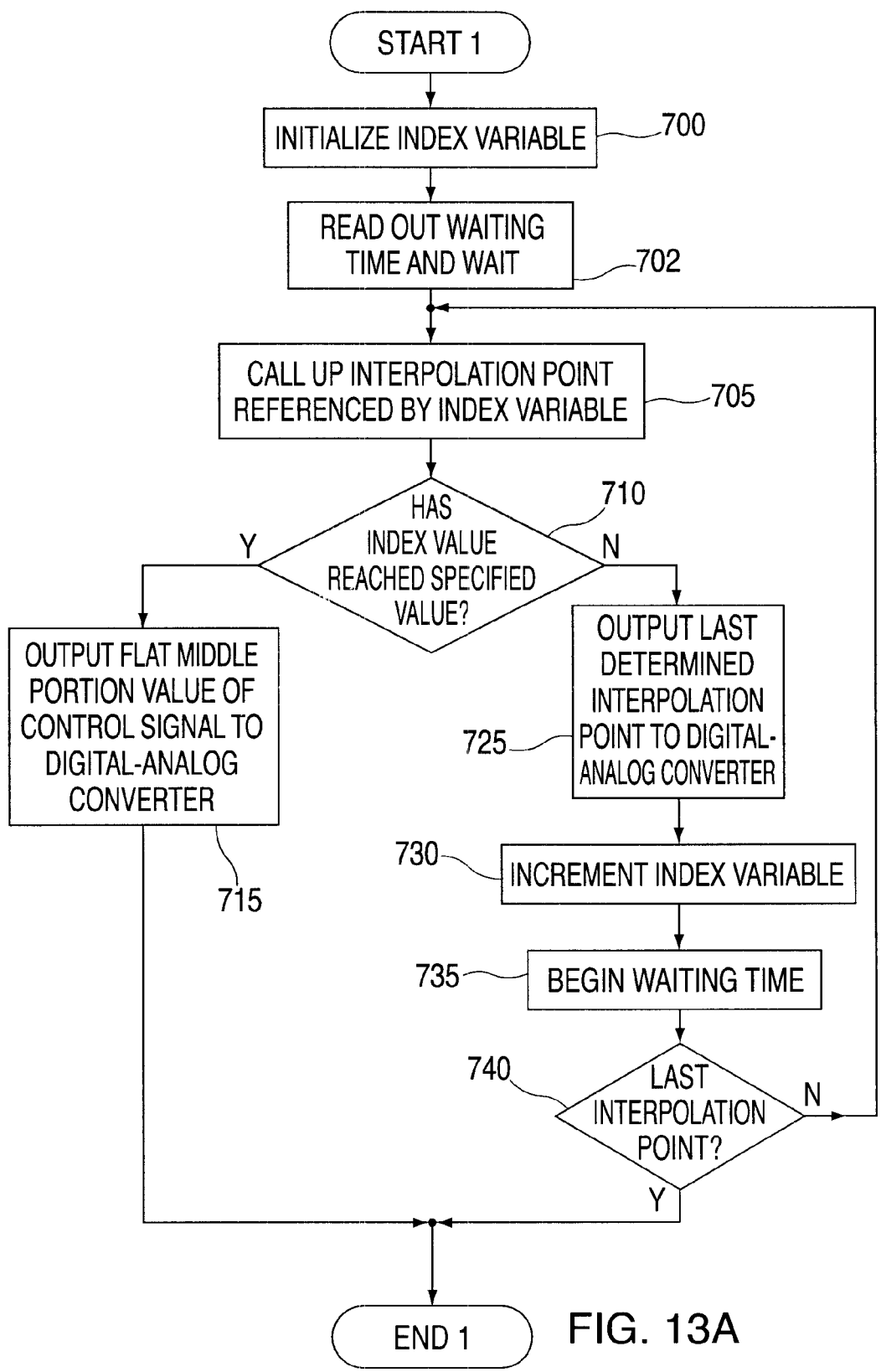
FIG. 13 shows two flow charts for a sixth embodiment.
Figure 13B:
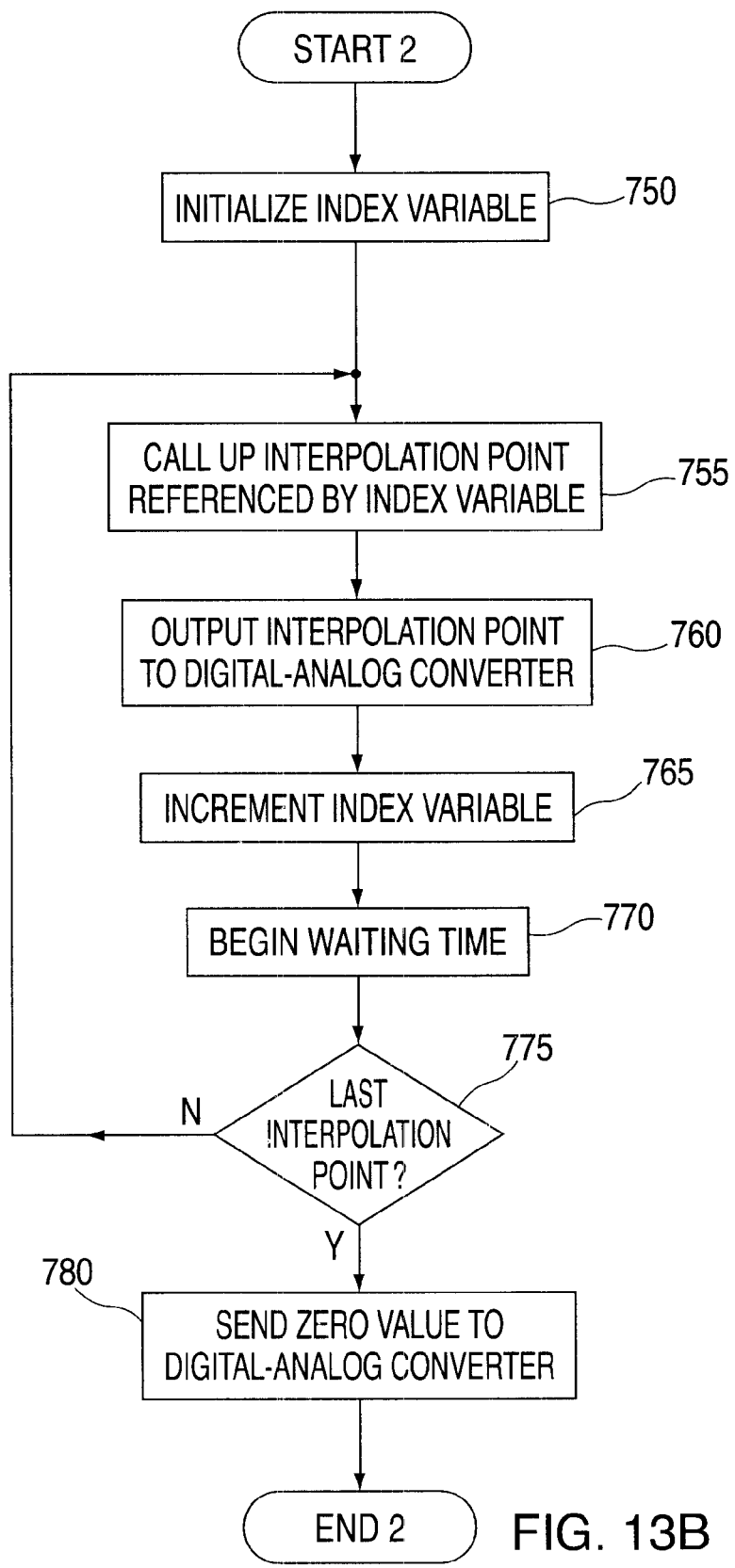

The circuit described above and illustrated in FIG. 6 is once again used in a further embodiment. FIG. 13 shows the flow charts for this embodiment. As in the embodiment described above, two flow charts for generating control signal 8, 9 needed for a desired transmitter output power are used in this embodiment. A first flow chart, identified by START 1, is processed for increasing the transmitted signal level, while a second flow chart, identified by START 2, is processed for the desired decrease in transmitted signal level.

This embodiment does not include a level comparison between the interpolation points of reference control signal 5 and maximum control signal 6, 7 defined for desired power level m. Only a partial sequence of interpolation points of reference control signal 5 is output to the control circuit via digital-analog converter 60.

Four parameters are stored in data memory 91 for each of the m possible power levels. This includes a level value for the flat middle portion of the transmission burst, which is constantly present during data transmission. In this embodiment, this level value can be lower than some interpolation points of the partial sequence of reference control signal 5 used for power level m, since the signal level is not used as a distinguishing criterion when selecting the partial sequence needed. Waiting time $t_m$ before the first interpolation point is output, the number of interpolation points to be processed during the transmitted signal rise, and the number of interpolation points to be skipped before the transmitted signal decreases are also stored for each power level m.

Figure 14:
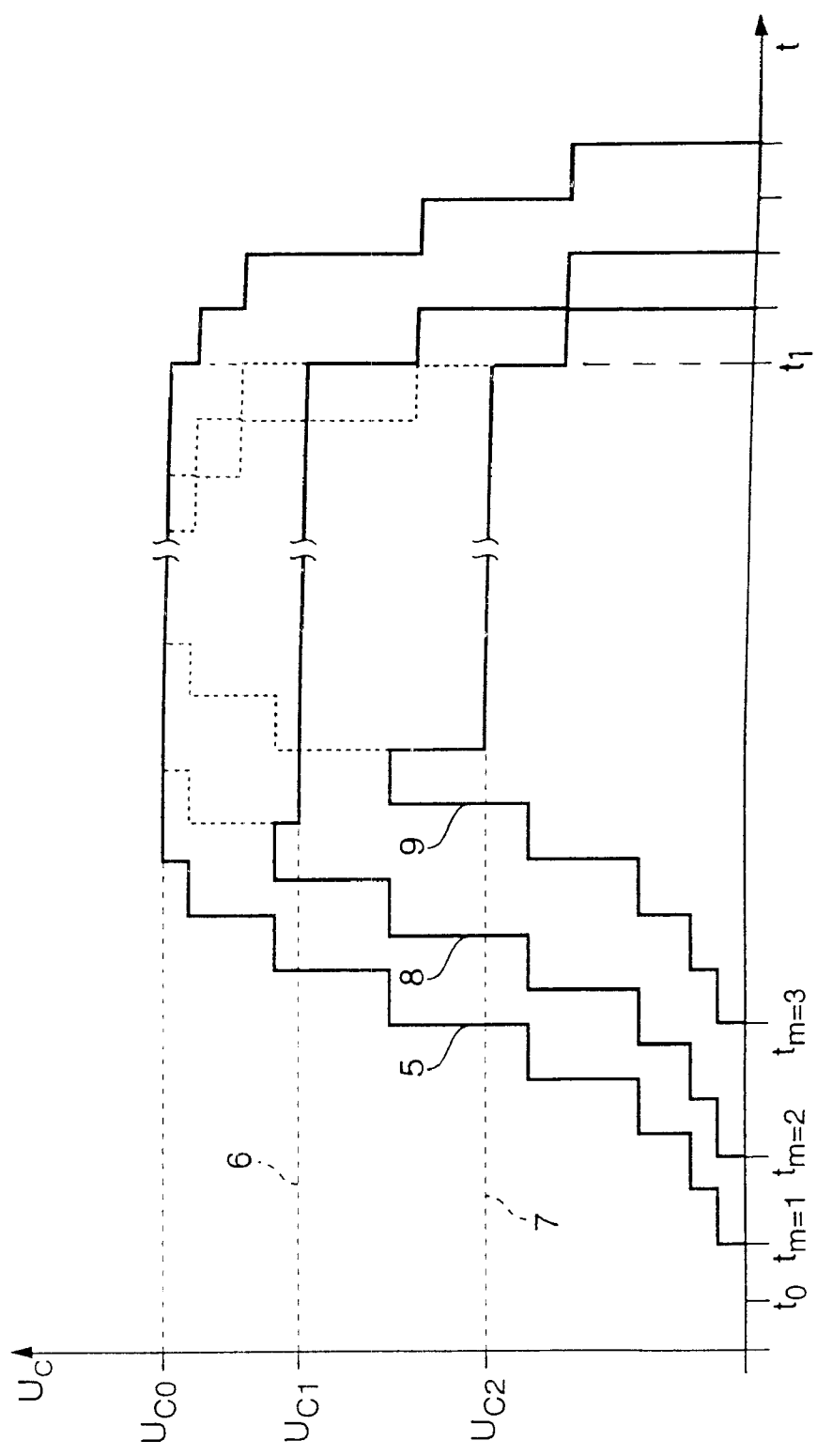
FIG. 14 shows a variation over time of three control signals according to the sixth embodiment.

At time $t_0$ before the transmitted signal begins to rise, as shown in FIG. 14, the first sequence of reference control signal 5 is called up in step START 1, as shown by the flow chart in FIG. 13. With this call, a base station transmits value m for the desired power level of the transmitter output power to sequence control system 81 by radio. In program step 700, access to the first interpolation point of reference control signal 5 is prepared by initializing the index variable. During the subsequent program loop passes, the value of the index variable forms a pointer to the interpolation point to be processed and also represents the number of interpolation points already processed.

In program step 702, the value of waiting time $t_m$ stored for desired power level m is read out from data memory 91. At the end of waiting time $t_m$, the interpolation point referenced by the index variable is called up from data memory 91 in program step 705. In step 710, the program checks the current value of the index variable to determine whether the number of interpolation points already output has reached the value specified for power level m during the transmitted signal rise, i.e., the value entered in data memory 91. If so, the program branches to step 715; if not, it branches to step 725. In program step 715, the level value for the flat middle portion of control signal 8, 9 is output to digital-analog converter 60 for desired power level m, and the program segment ends.

In program step 725, however, the interpolation point of reference control signal 5 last determined is output to digital-analog converter 60. In program step 730, the index variable is incremented so that it points to the next interpolation point to be output. A waiting time, which remains constant for all program calls and passes and is determined by the desired clock rate for interpolation point output, begins in program step 735. In step 740, the program checks whether the value just output to digital-analog converter 60 was the last interpolation point in the power increase, which means that maximum value $U_{c0}$ of reference control signal 5 has been reached. If so, the program segment ends; if not, the program branches to step 705 and calls up the next interpolation point.

As shown in FIG. 14, the transmitter output power begins decreasing at time $t_1$ in that the second sequence of interpolation points of reference control signal 5 is called up in program step START 2. With this call as well, the base station transmits value m for the current power level of the transmitter output power to the sequence control system by radio. In program step 750, the index variable containing the number, incremented by 1, of the interpolation points to be skipped for this power level m is initialized so that it now points to the first interpolation point of reference control signal 5 to be output for this transmitter output power. In program step 755, the interpolation point referenced by the index variable is called up from data memory 91. In program step 760, this interpolation point of reference control signal 5 is output to digital-analog converter 60. The index variable is incremented in program step 765, and a waiting time, which remains the same for all program passes, is carried out in programs step 770.

In step 775, the program checks whether the interpolation point last output was the last value of reference control signal 5. If so, the program branches to step 780; if not, it branches back to step 755 and calls up the next interpolation point. In program step 780, a value of zero is sent to digital-analog converter 60, and the program ends.

FIG. 14 shows the voltage variations of control signals $U_c$ over time t for m=3 power levels of the transmitter output signal. When the signal increases to the maximum transmitter output power, all interpolation points of reference control signal 5 are used, i.e., they are output to the non-negated input (+) of summation point 45 in the power control circuit via digital-analog converter 60. This yields a voltage variation of reference control signal 5 that begins at a time $t_{m=1}$, which is offset from time $t_0$, at the output of digital-analog converter 60. Both control signals 8, 9 are produced at low power levels m of the transmitter output power, with first control signal 8 beginning at time $t_{-2}$, which is offset from time $t_{m=1}$, and second control signal 9 beginning at a time $t_{m=3}$, which is offset from time $t_{-2}$. It is clear that the interpolation points of reference control signal 5 last output in this embodiment are greater during the increase in transmitter output power than the level value used for the flat middle portion of the transmission burst, i.e., the level used during data transmission. The interpolation points represented by the dotted lines are no longer carried out while the transmitter output power increases, and are skipped when the transmitter output power decreases.

As shown in FIG. 14, the level value used during data transmission for reference control signal 5 takes on maximum value $U_{c0}$ of reference control signal 5, maximum value $U_{c1}$ for first control signal 8, which corresponds to first preset maximum control signal value 6, and maximum value $U_{c2}$ for second control signal 9, which corresponds to second preset maximum control signal value 7.

What is claimed is:

1. A method for controlling a power gain for outputting a transmitted signal from a radio device, comprising the steps of:
    increasing an output power to a preset power level along a preset characteristic curve at a beginning of the transmitted signal;
    decreasing the output power along the preset characteristic curve at an end of the transmitted signal;
    using a reference control signal for a rising edge and a falling edge of a control signal, the control signal controlling accordingly the power gain;
    limiting the control signal to a preset maximum control signal value; and
    outputting the transmitted signal with a preset time delay, the preset time delay being a function of at least a preset power level for outputting the transmitted signal.

2. The method according to claim 1, wherein the step of limiting includes the step of comparing the reference control signal with the preset maximum control signal value at one of specific times and continuous times, the control signal being limited to the preset maximum control signal value if the reference control signal exceeds the preset maximum control signal value.

3. The method according to claim 1, wherein the step of limiting includes the step of limiting the control signal to the preset maximum control signal value at an end of a preset signal rise time.

4. The method according to claim 1, wherein the step of limiting includes the step of switching the control signal from the reference control signal to the preset maximum control signal value.

5. The method according to claim 1, wherein the preset time delay increases as the preset power level decreases.

6. The method according to claim 2, wherein the step of comparing includes the step of comparing at predefined time intervals.

7. The method according to claim 1, further comprising the step of:
    selecting an amount of a portion of the reference control signal assumed by the control signal as a function of at least the preset power level.

8. The method according to claim 1, further comprising the step of:
    increasing an amount of a portion of the reference control signal not assumed by the control signal as the preset power level decreases.

9. The method according to claim 1, further comprising the steps of:
    determining the output power actually achieved at an output of a power amplification circuit with aid of a detector; and
    returning a controlled variable to a control loop of the power amplification circuit.

* * * * *

UNITED STATES PATENT AND TRADEMARK OFFICE
CERTIFICATE OF CORRECTION

PATENT NO.    : 6,477,358 B1
DATED         : November 5, 2002
INVENTOR(S)   : Mader et al.

It is certified that error appears in the above-identified patent and that said Letters Patent is hereby corrected as shown below:

Column 1,
Line 21, delete "having the features of the main claim".
Line 22, delete "over the related art".
Lines 29-31, delete "The features listed … described in the main claim".
Line 42, change "needed" to -- used --.

Column 2,
Line 59, "30" to -- 60 --.

Column 3,
Line 5, change "arrangement" to -- arrangement according to the present invention --.

Column 6,
Line 8, change "322" to -- 365 --.
Line 44, change "time t." to -- time t according to the present invention --.
Line 49, delete "always".
Line 64, change "tame" to -- time --.

Column 7,
Line 4, change "55" to -- 50 --.

Column 8,
Line 42, change "charts for" to -- charts according to the present invention for --.
Line 46, change "signal." to -- signal according to the present invention. --.

Column 9,
Line 1, change "425" to -- 415 --.
Line 44, change "signal." to -- signal according to the present invention. --.

Column 10,
Line 8, change "embodiment." to -- embodiment according to the present invention. --.
Line 9, change "system 81" to -- system 81 according to the present invention. --.

Column 11,
Line 11, change "power." to -- power according to the present invention. --.

Column 13,
Line 34, change "output signal." to -- output signal according to the present invention. --.
Lines 42 and 43, change "embodiment." to -- embodiment according to the present invention. --.
Line 45, change "8,9 are needed for a desired transmitter output power are used" to -- 8,9 are used for a desired transmitter output power --.

UNITED STATES PATENT AND TRADEMARK OFFICE
CERTIFICATE OF CORRECTION

PATENT NO. : 6,477,358 B1
DATED : November 5, 2002
INVENTOR(S) : Mader et al.

It is certified that error appears in the above-identified patent and that said Letters Patent is hereby corrected as shown below:

Column 15,
Line 3, change "signal." to -- signal according to the present invention. --.

Signed and Sealed this

Fourteenth Day of October, 2003

JAMES E. ROGAN
*Director of the United States Patent and Trademark Office*